US012757777B2

United States Patent
(12) United States Patent
Park et al.

(10) Patent No.: US 12,757,777 B2
(45) Date of Patent: Oct. 6, 2026

(54) SEMICONDUCTOR DEVICE AND METHOD OF FABRICATING THE SAME

(71) Applicant: Samsung Electronics Co., Ltd., Suwon-si (KR)

(72) Inventors: Kunsang Park, Suwon-si (KR); Ho-Jin Lee, Suwon-si (KR); Seokho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 796 days.

(21) Appl. No.: 18/120,026

(22) Filed: Mar. 10, 2023

(65) Prior Publication Data

US 2024/0038708 A1 Feb. 1, 2024

(30) Foreign Application Priority Data

Jul. 26, 2022 (KR) ........................ 10-2022-0092132

(51) Int. Cl.

*H10W 72/20* (2026.01)
*H10W 72/00* (2026.01)
*H10W 80/00* (2026.01)
*H10W 90/00* (2026.01)
*H10W 99/00* (2026.01)

(52) U.S. Cl.

CPC ......... *H10W 72/20* (2026.01); *H10W 72/012* (2026.01); *H10W 99/00* (2026.01); *H10W 72/01238* (2026.01); *H10W 72/234* (2026.01); *H10W 72/252* (2026.01); *H10W 72/253* (2026.01); *H10W 80/312* (2026.01); *H10W 80/327* (2026.01); *H10W 90/722* (2026.01)

(58) Field of Classification Search

CPC ............................ H01L 24/16; H10W 72/012
See application file for complete search history.

(56) References Cited

U.S. PATENT DOCUMENTS

| | | | | |
|---|---|---|---|---|
| 7,872,357 | B2 * | 1/2011 | Yu ........................ | H10W 20/023 438/109 |
| 9,461,007 | B2 | 10/2016 | Chun et al. | |
| 9,601,371 | B2 | 3/2017 | Edelstein et al. | |
| 9,620,481 | B2 | 4/2017 | Edelstein et al. | |
| 11,244,916 | B2 | 2/2022 | Uzoh et al. | |
| 11,264,345 | B2 * | 3/2022 | Enquist ................. | H10W 72/90 |
| 2004/0262772 | A1 * | 12/2004 | Ramanathan ....... | H10W 72/012 438/455 |

(Continued)

FOREIGN PATENT DOCUMENTS

| | | | |
|---|---|---|---|
| JP | 2019165110 | A | 9/2019 |
| KR | 20140115948 | A | 10/2014 |

*Primary Examiner* — William A Harriston
(74) *Attorney, Agent, or Firm* — Muir Patent Law, PLLC

(57) ABSTRACT

A semiconductor device may include a lower structure including a first substrate, a first pad on the first substrate, and a first insulating layer enclosing the first pad, and an upper structure including a second substrate, a second pad on the second substrate, and a second insulating layer enclosing the second pad. Each of the first and second pads may include a first portion and a second portion on the first portion. The second portion may include the same metallic material as the first portion. The second portion of the first pad may be in contact with the second portion of the second pad, and the first insulating layer may be in contact with the second insulating layer.

18 Claims, 19 Drawing Sheets

(56) References Cited

U.S. PATENT DOCUMENTS

| | | | | |
|---|---|---|---|---|
| 2009/0224371 | A1* | 9/2009 | Yu | H10W 20/023<br>438/109 |
| 2014/0175655 | A1* | 6/2014 | Chen | H10W 20/20<br>228/172 |
| 2016/0056112 | A1* | 2/2016 | Edelstein | H10P 14/6314 |
| 2019/0237419 | A1* | 8/2019 | Enquist | H01L 21/52 |
| 2020/0051937 | A1* | 2/2020 | Uzoh | H10W 72/90 |
| 2021/0066233 | A1 | 3/2021 | Fountain, Jr. et al. | |
| 2022/0199561 | A1* | 6/2022 | Kim | H10W 70/65 |
| 2023/0132272 | A1* | 4/2023 | Oh | H10W 70/60<br>257/295 |
| 2023/0138813 | A1* | 5/2023 | Seo | H10W 20/20<br>257/774 |
| 2024/0030169 | A1* | 1/2024 | Kim | H10W 72/019 |
| 2024/0096831 | A1* | 3/2024 | Jo | H10W 20/0245 |
| 2024/0113057 | A1* | 4/2024 | Kim | H10W 20/20 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0092132, filed on Jul. 26, 2022, in the Korean Intellectual Property Office, the entire contents of which are hereby incorporated by reference.

BACKGROUND OF THE INVENTION

The present disclosure relates to a directly-bonded semiconductor device and a method of fabricating the same.

In the semiconductor industry, various package technologies have been developed to meet increasing demands for a semiconductor device and/or an electronic product having a large capacity, a small thickness, and a small size. For example, a package technology of vertically stacking semiconductor chips has been suggested to realize a high-density chip stacking structure. This technology makes it possible to integrate semiconductor chips of various functions within a small area, compared with a typical package structure composed of a single semiconductor chip.

A semiconductor package includes a semiconductor chip that is provided to be easily used as a part of an electronic product. In general, the semiconductor package includes a printed circuit board (PCB) and a semiconductor chip, which is mounted on the PCB and is electrically connected to the PCB using bonding wires or bumps. With the development of the electronic industry, various studies are being conducted to improve reliability and durability of the semiconductor package.

SUMMARY

An embodiment of the inventive concept provides a semiconductor device, which is configured to have high driving stability and improved electric characteristics, and a method of fabricating the same.

According to an embodiment of the inventive concept, a semiconductor device may include a lower structure including a first substrate, a first pad on the first substrate, and a first insulating layer enclosing the first pad, and an upper structure including a second substrate, a second pad on the second substrate, and a second insulating layer enclosing the second pad. Each of the first and second pads may include a first portion and a second portion on the first portion. The second portion may include the same metallic material as the first portion. The second portion of the first pad may be in contact with the second portion of the second pad, and the first insulating layer may be in contact with the second insulating layer.

According to an embodiment of the inventive concept, a semiconductor device may include a lower structure including a first circuit pattern provided on a first substrate, a first insulating layer provided on the first substrate to cover the first circuit pattern, and a first pad disposed in the first insulating layer and connected to the first circuit pattern, and an upper structure vertically connected to the lower structure, the upper structure including a second circuit pattern provided on a second substrate, a second insulating layer provided on the second substrate to cover the second circuit pattern, and a second pad disposed in the second insulating layer and connected to the second circuit pattern. The first insulating layer may be in direct contact with the second insulating layer. Each of the first and second pads may include a first portion and a second portion, which is provided on the first portion and includes the same metallic material as the first portion. The second portion of the first pad and the second portion of the second pad may be bonded to each other to form a single object.

According to an embodiment of the inventive concept, a method of fabricating a semiconductor device may include forming a first insulating layer on a first substrate, patterning the first insulating layer to form a first recess portion, forming a first conductive layer on the first insulating layer to fill the first recess portion, performing a first planarization process on the first conductive layer to expose a top surface of the first insulating layer and to form a first portion of a first pad, a top surface of the first portion being located at a level lower than the top surface of the first insulating layer, performing a selective deposition process to form a second portion on the first portion of the first pad, the second portion including the same metallic material as the first portion, forming a second insulating layer on a second substrate, patterning the second insulating layer to form a second recess portion, forming a second conductive layer on the second insulating layer to fill the second recess portion, performing a second planarization process on the second conductive layer to expose a top surface of the second insulating layer and to form a second pad, and performing a thermal treatment process to bond the first pad to the second pad.

DETAILED DESCRIPTION

Figure 1:
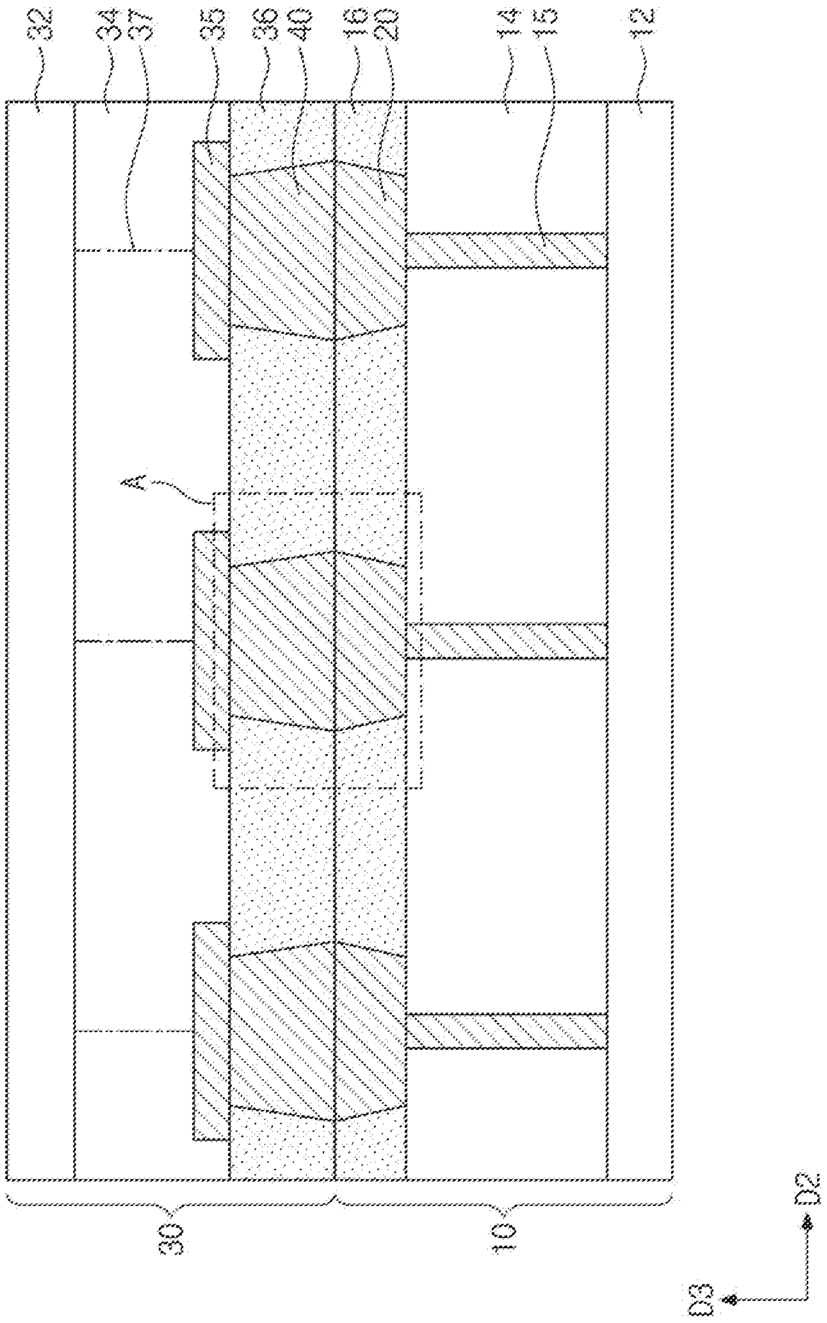
FIG. 1 is a sectional view illustrating a semiconductor device, according to an example embodiment of the inventive concept.

Example embodiments of the inventive concepts will now be described more fully with reference to the accompanying drawings, in which example embodiments are shown. Like reference numerals in the drawings denote like elements, and thus their description will be omitted.

Spatially relative terms, such as “beneath,” “below,” “lower,” “above,” “upper” and the like, may be used herein for ease of description to describe one element’s or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” other elements or features would then be oriented “above” the other elements or features. Thus, the term “below” can encompass both an orientation of above and below. The device may be otherwise oriented (rotated 180 degrees or at other orientations) and the spatially relative descriptors used herein interpreted accordingly. As used herein, the term “contact” refers to a direct connection (i.e., touching) unless the context indicates otherwise.

Figure 2:
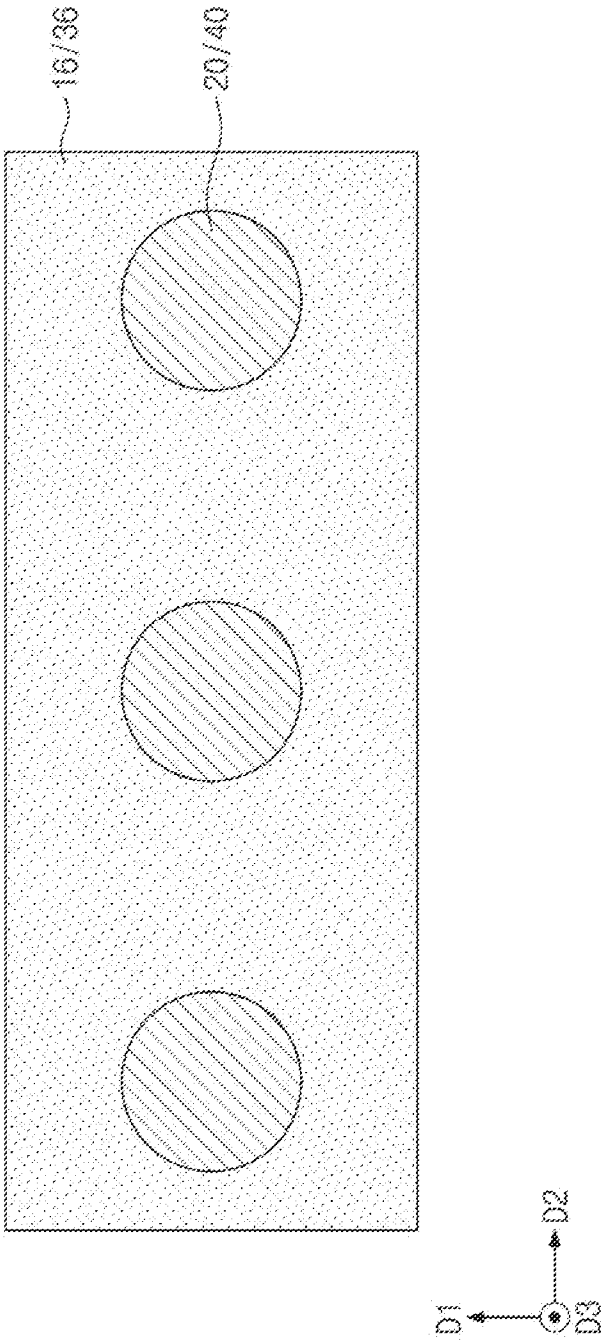
FIGS. 2 and 3 are plan views illustrating a semiconductor device, according to an example embodiment of the inventive concept.
Figure 3:
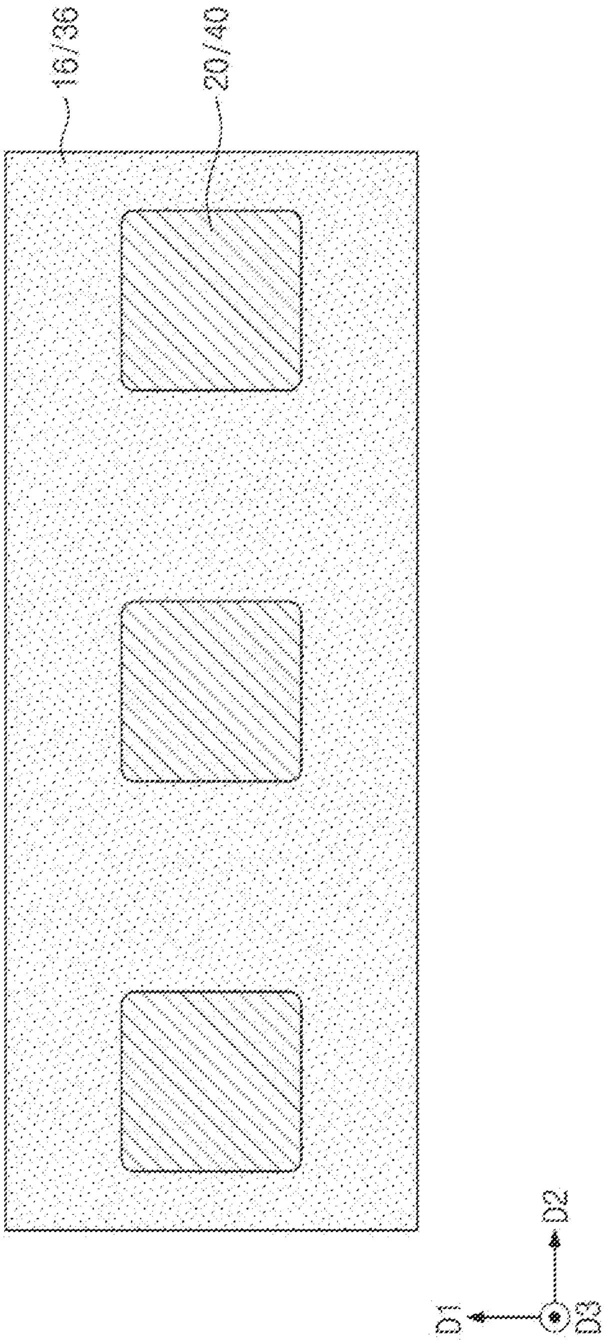
Figure 4:
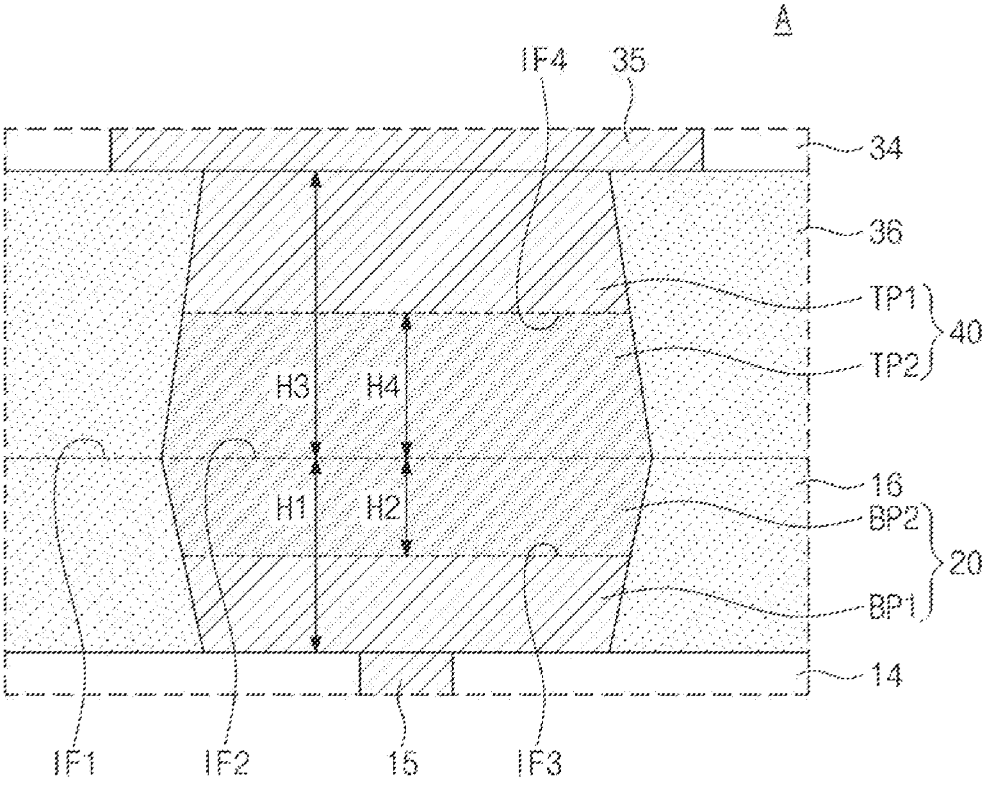
FIG. 4 is an enlarged sectional view illustrating a portion A of FIG. 1.

FIG. 1 is a sectional view illustrating a semiconductor device according to an example embodiment of the inventive concept. FIGS. 2 and 3 are plan views illustrating a semiconductor device according to an example embodiment of the inventive concept. FIG. 4 is an enlarged sectional view illustrating a portion A of FIG. 1.

Referring to FIG. 1, a semiconductor device may include a lower structure 10 and an upper structure 30 stacked on the lower structure 10.

The lower structure 10 may include a first substrate 12, a first circuit layer 14, a first insulating layer 16, and first pads 20.

The first substrate 12 may be provided. The first substrate 12 may be a semiconductor substrate, such as a semiconductor wafer. The first substrate 12 may be a bulk silicon substrate, a silicon-on-insulator (SOI) substrate, a germanium substrate, a germanium-on-insulator (GOI) substrate, a silicon-germanium substrate, or a substrate including an epitaxial layer grown using a selective epitaxial growth (SEG) technique. For example, the first substrate 12 may be formed of or may include at least one of silicon (Si), germanium (Ge), silicon germanium (SiGe), gallium arsenic (GaAs), indium gallium arsenic (InGaAs), or aluminum gallium arsenic (AlGaAs). Alternatively, the first substrate 12 may be an insulating substrate.

The first circuit layer 14 may be provided on the first substrate 12. The first circuit layer 14 may include a first circuit pattern provided on the first substrate 12 and an insulating layer covering the first circuit pattern. The first circuit pattern may be a memory circuit including one or more transistors, a logic circuit including one or more transistors, or one of combinations thereof. Alternatively, the first circuit pattern may include a passive device, such as a resistor or a capacitor.

The first pads 20 may be disposed on the first circuit layer 14. The first pads 20 may have a damascene structure. For example, the first pad 20 may include a seed layer or a barrier layer, which is provided to cover side and bottom surfaces thereof. A width of the first pad 20 may decrease as a distance to the first substrate 12 decreases. Although not shown, the first pad 20 may include a via portion and a pad portion, which are sequentially stacked and are connected to each other to form a single object, and may have a ‘T’-shaped section. The width of the first pad 20 may range from 2 μm to 30 μm. However, the inventive concept is not limited to this example. The first pads 20 may be formed of or may include at least one of metallic materials. As an example, the first pads 20 may be formed of or may include copper (Cu).

The first pads 20 may be electrically connected to the first circuit pattern of the first circuit layer 14. A first connection line 15 may be provided in the first circuit layer 14. The first connection line 15 may be a penetration via, which is provided to vertically penetrate an insulating pattern in the first circuit layer 14. The first connection line 15 may be vertically extended in the first circuit layer 14 and may be connected to the first pads 20. The first connection line 15 may be provided to electrically connect the first circuit pattern to the first pads 20. Although not illustrated in the drawings, various conductive patterns, which may be used as interconnection lines, may be provided between the first circuit pattern and the first connection line 15. Alternatively, the first connection line 15 may be an under pad pattern or a redistribution pattern, which is provided in the insulating pattern in the first circuit layer 14. In this case, various conductive patterns, which may be used as interconnection lines, may be provided between the first circuit pattern and the first connection line 15. However, the inventive concept is not limited to this example, and in some embodiments, the shape of the first circuit layer 14 may be variously changed and the connection between the first pads 20 and the first circuit layer 14 may be achieved using various elements.

The first insulating layer 16 may be disposed on the first circuit layer 14. The first insulating layer 16 on the first circuit layer 14 may be provided to enclose the first pads 20. For example, the first insulating layer 16 may completely surround and contact side surfaces of the first pads 20. The first insulating layer 16 may be provided to expose top surfaces of the first pads 20. A top surface of the first insulating layer 16 may be coplanar with the top surfaces of the first pads 20. The first insulating layer 16 may be formed of or may include at least one of oxide, nitride, or oxynitride materials, which include an element that is contained in the first substrate 12 or the first circuit layer 14. The first insulating layer 16 may be formed of or may include at least one of insulating materials (e.g., silicon oxide (SiO), silicon nitride (SiN), silicon oxynitride (SiON), or silicon carbon nitride (SiCN)).

The upper structure 30 may include a second substrate 32, a second circuit layer 34, a second insulating layer 36, and second pads 40.

The second substrate 32 may be provided. The second substrate 32 may be a semiconductor substrate (e.g., a semiconductor wafer). The second substrate 32 may be a bulk silicon substrate, a silicon-on-insulator (SOI) substrate, a germanium substrate, a germanium-on-insulator (GOI) substrate, a silicon-germanium substrate, or a substrate including an epitaxial layer grown using a selective epitaxial growth (SEG) technique. For example, the second substrate 32 may be formed of or may include at least one of silicon (Si), germanium (Ge), silicon germanium (SiGe), gallium arsenic (GaAs), indium gallium arsenic (InGaAs), or aluminum gallium arsenic (AlGaAs). Alternatively, the second substrate 32 may be an insulating substrate.

The second circuit layer 34 may be provided on the second substrate 32. The second circuit layer 34 may include a second circuit pattern, which is provided on the second substrate 32, and an insulating layer, which is provided to cover the second circuit pattern. The second circuit pattern may be a memory circuit including one or more transistors, a logic circuit including one or more transistors, or one of combinations thereof. Alternatively, the second circuit pattern may include a passive device, such as a resistor or a capacitor.

The second pads 40 may be disposed on the second circuit layer 34. The second pad 40 may have a damascene structure. For example, the second pad 40 may include a seed layer or a barrier layer, which is provided to cover side and bottom surfaces thereof. A width the second pad 40 may decrease as a distance to the second substrate 32 decreases. Although not shown, the second pad 40 may include a via portion and a pad portion, which are sequentially stacked and are connected to each other to form a single object, and may have a 'T'-shaped section.

A thickness in the third direction D3 of the second pad 40 may be larger than a thickness in the third direction D3 of the first pad 20. However, the inventive concept is not limited to this example, and in an embodiment, the thickness of the first pad 20 and the thickness of the second pad 40 may be variously changed. A width in the horizontal direction of the second pad 40 may range from 2 μm to 30 μm. However, the inventive concept is not limited to this example. The second pads 40 may be formed of or may include at least one of metallic materials. As an example, the second pads 40 may be formed of or may include copper (Cu).

The second pads 40 may be electrically connected to the second circuit pattern of the second circuit layer 34. A second connection line 35 may be provided in the second circuit layer 34. The second connection line 35 may be an under pad pattern or a redistribution pattern, which is provided in an insulating pattern in the second circuit layer 34. In example embodiments, a surface of the second connection line 35 may be coplanar with a surface of the second circuit layer 34. The second connection line 35 may be vertically extended in the second circuit layer 34 and may be connected to the second pads 40. For example, the second connection line 35 may contact the second pads 40. The second connection line 35 may be provided to electrically connect the second circuit pattern to the second pads 40. At least one conductive pattern 37, which is used as interconnection lines, may be provided between the second circuit pattern and the second connection line 35, although it is briefly illustrated in FIG. 1. Alternatively, the second connection line 35 may be a penetration via, which is provided to vertically penetrate the insulating pattern in the second circuit layer 34. However, the inventive concept is not limited to this example, and in some embodiments, the shape of the second circuit layer 34 may be variously changed and the connection between the second pads 40 and the second circuit layer 34 may be achieved using various elements.

The second insulating layer 36 may be disposed on the second circuit layer 34. For example, the second insulating layer 36 may contact the second circuit layer 34. In example embodiments, a portion of the second circuit layer 34 may contact portions of the exposed surfaces of the second connection line 35. In an embodiment, the second insulating layer 36 may be provided on the second circuit layer 34 to enclose the second pads 40. For example, the second insulating layer 36 may completely surround and contact side surfaces of the second pads 40. The second insulating layer 36 may be provided to expose bottom surfaces of the second pads 40. A bottom surface of the second insulating layer 36 may be coplanar with the bottom surfaces of the second pads 40. The second insulating layer 36 may be formed of or may include at least one of oxide, nitride, or oxynitride materials, which include an element that is contained in the second substrate 32 or the second circuit layer 34. The second insulating layer 36 may be formed of or may include the same material as the first insulating layer 16. The second insulating layer 36 may be formed of or may include at least one of insulating materials (e.g., silicon oxide (SiO), silicon nitride (SiN), silicon oxynitride (SiON), or silicon carbon nitride (SiCN)).

Referring to FIG. 2, each of the first and second pads 20 and 40 may have a circular shape, when viewed in a plan view. Alternatively, as shown in FIG. 3, the planar shapes of the first and second pads 20 and 40 may be rectangular or square. However, the inventive concept is not limited to this example, and in an embodiment, the planar shapes of the first and second pads 20 and 40 may be variously changed.

The planar shape of the second pads 40 may be substantially the same as the planar shape of the first pads 20. Alternatively, the planar shape of the second pads 40 may be different from the planar shape of the first pads 20.

Referring to FIG. 4, the first pads 20 of the lower structure 10 and the second pads 40 of the upper structure 30 may be vertically aligned to each other. The lower and upper structures 10 and 30 may be in contact with each other such that the first and second pads 20 and 40 are connected to each other. For example, the first and second pads 20 and 40 may contact each other.

Each of the first pads 20 of the lower structure 10 may include first and second portions BP1 and BP2. The second portion BP2 of the first pad 20 may be provided on the first portion BP1 of the first pad 20. The first and second portions BP1 and BP2 of the first pad 20 may be in contact with each other. For example, a top surface of the first portion BP1 of the first pad 20 may be substantially the same shape as a bottom surface of the second portion BP2 of the first pad 20. The first pad 20 may have a first height H1 in a third direction D3. The first height H1 may be substantially equal to a height of the first insulating layer 16 in the third direction D3. The second portion BP2 of the first pad 20 may have a second height H2 in the third direction D3. The first height H1 may be larger than the second height H2. A difference between the first height H1 and the second height H2 may be about 10 Å to about 300 Å. A height of the first portion BP1 of the first pad 20 in the third direction D3 may be the difference between the first height H1 and the second height H2.

The second portion BP2 of the first pad 20 may be formed by a selective deposition process. In detail, the second portion BP2 of the first pad 20 may be formed in a [111] direction. For example, copper may have the greatest thermal expansion coefficient in the [111] direction, and thus, in the case where the first pad 20 includes copper (Cu), the first pad 20 may be easily bonded to the second pad 40 in a subsequent thermal treatment process. Accordingly, it may be possible to prevent a void from being formed between the first pad 20 and the second pad 40.

Since the first and second portions BP1 and BP2 of the first pad 20 include the same metallic material, a third interface IF3 between the first portion BP1 of the first pad 20 and the second portion BP2 of the first pad 20 may not be visible. By contrast, in the case where the first and second portions BP1 and BP2 of the first pad 20 have different grain sizes from each other, the third interface IF3 may be visible. The second portion BP2 of the first pad 20 may have a grain size that is smaller than that of the first portion BP1 of the first pad 20. The smaller the grain size, the greater the yield strength. For example, the second portions BP2 and TP2 of the first and second pads 20 and 40 may be bonded to each other to form a robust bonding structure having high yield strength.

The second pad 40 of the upper structure 30 may include first and second portions TP1 and TP2. The second portion TP2 of the second pad 40 may be provided on the first portion TP1 of the second pad 40. The first and second portions TP1 and TP2 of the second pad 40 may be in contact with each other. For example, a top surface of the first portion TP1 of the second pad 40 may be substantially the same shape as a bottom surface of the second portion TP2 of the second pad 40. The second pad 40 may have a third height H3 in the third direction D3. The third height H3 may be substantially equal to a height of the second insulating layer 36 in the third direction D3. The second portion TP2 of the second pad 40 may have a fourth height H4 in the third direction D3. The third height H3 may be larger than the fourth height H4. A difference between the third height H3 and the fourth height H4 may be about 10 Å to about 300 Å. A height of the first portion TP1 in the third direction D3 may be the difference between the third height H3 and the fourth height H4.

The second portion TP2 of the second pad 40 may have substantially the same features as the second portion BP2 of the first pad 20 described above. For example, the second portion TP2 of the second pad 40 may comprise a material having a [111] direction. The second portion TP2 of the second pad 40 may have a grain size that is smaller than the first portion TP1 of the second pad 40. A fourth interface IF4 between the first portion TP1 of the second pad 40 and the second portion TP2 of the second pad 40 may be visible, but in an embodiment, the fourth interface IF4 may not be visible.

The upper structure 30 may be connected to the lower structure 10. In detail, the lower and upper structures 10 and 30 may be in direct contact with each other. At the interface between the lower and upper structures 10 and 30, the second portion BP2 of the first pad 20 of the lower structure 10 may be bonded to the second portion TP2 of the second pad 40 of the upper structure 30. Here, the second portions BP2 and TP2 of the first and second pads 20 and 40 may form an intermetal hybrid bonding structure. In the present specification, the hybrid bonding structure may mean a bonding structure, in which two elements of the same kind are fused at an interface therebetween. For example, the second portion BP2 of the first pad 20 and the second portion TP2 of the second pad 40, which are bonded to each other, may have a continuous structure, and a second interface IF2 between the second portion BP2 of the first pad 20 and the second portion TP2 of the second pad 40 may not be visible. For example, since the second portion BP2 of the first pad 20 is formed of the same material as the second portion TP2 of the second pad 40, there may be no visible interface between the second portion BP2 of the first pad 20 and the second portion TP2 of the second pad 40. For example, the second portion BP2 of the first pad 20 and the second portion TP2 of the second pad 40 may be provided as a single element. For example, the second portion BP2 of the first pad 20 and the second portion TP2 of the second pad 40 may be bonded to each other to form a single object. The second portion BP2 of the first pad 20 and the second portion TP2 of the second pad 40 may be bonded together to be in material continuity with one another. For example, the second portion BP2 of the first pad 20 and the second portion TP2 of the second pad 40 may form a monolithic structure.

At the interface between the lower and upper structures 10 and 30, the first insulating layer 16 of the lower structure 10 may be bonded to the second insulating layer 36 of the upper structure 30. Here, the first and second insulating layers 16 and 36 may form a hybrid bonding structure of oxide, nitride, or oxynitride. For example, the first and second insulating layers 16 and 36, which are bonded to each other, may have a continuous structure, and a first interface IF1 between the first and second insulating layers 16 and 36 may not be visible. For example, the first and second insulating layers 16 and 36 may be formed of the same material, and in this case, there may be no interface between the first and second insulating layers 16 and 36. For example, the first and second insulating layers 16 and 36 may be provided as a single element. The first and second insulating layers 16 and 36 may be bonded together to be in material continuity with one another. For example, the first and second insulating layers 16 and 36 may form a monolithic structure. For example, the first and second insulating layers 16 and 36 may be bonded to each other to form a single object. However, the inventive concept is not limited to this example. The first and second insulating layers 16 and 36 may be formed of materials different from each other. The first and second insulating layers 16 and 36 may not have a continuous structure, and the first interface IF1 between the first and second insulating layers 16 and 36 may be visible. The first and second insulating layers 16 and 36 may not be bonded to each other, and each of the first and second insulating layers 16 and 36 may be provided as an individual element.

Figure 5:
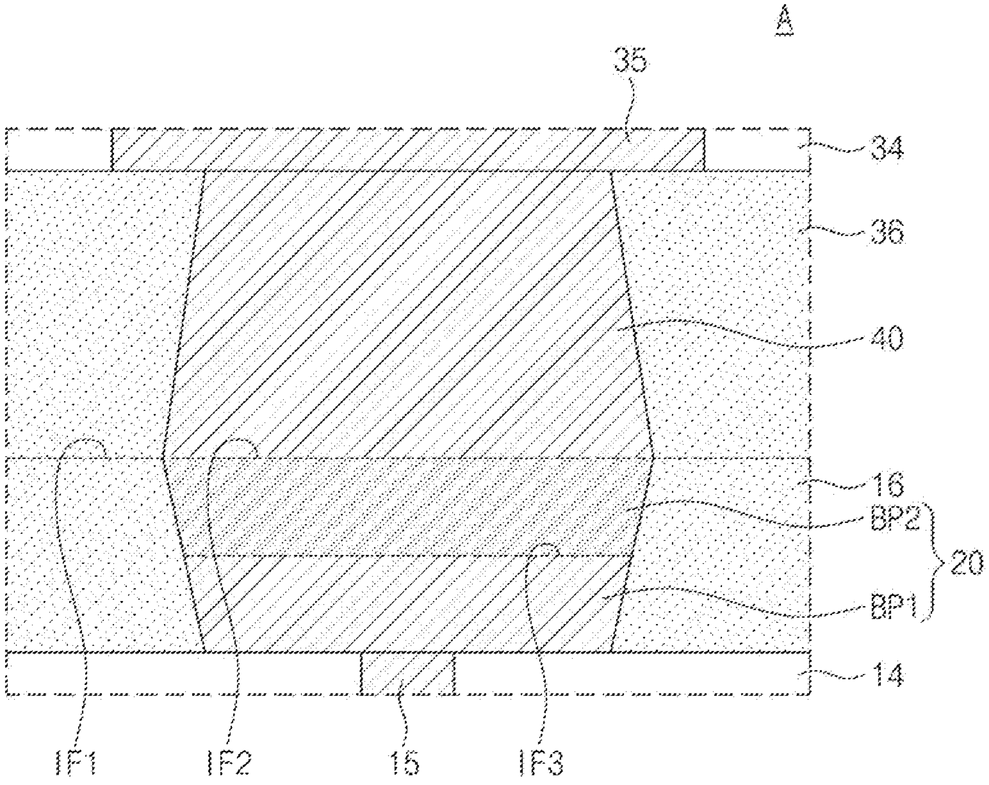
FIGS. 5 to 7 are enlarged sectional views, each of which illustrates a portion (e.g., A of FIG. 1) of a semiconductor device, according to an example embodiment of the inventive concept.
Figure 6:
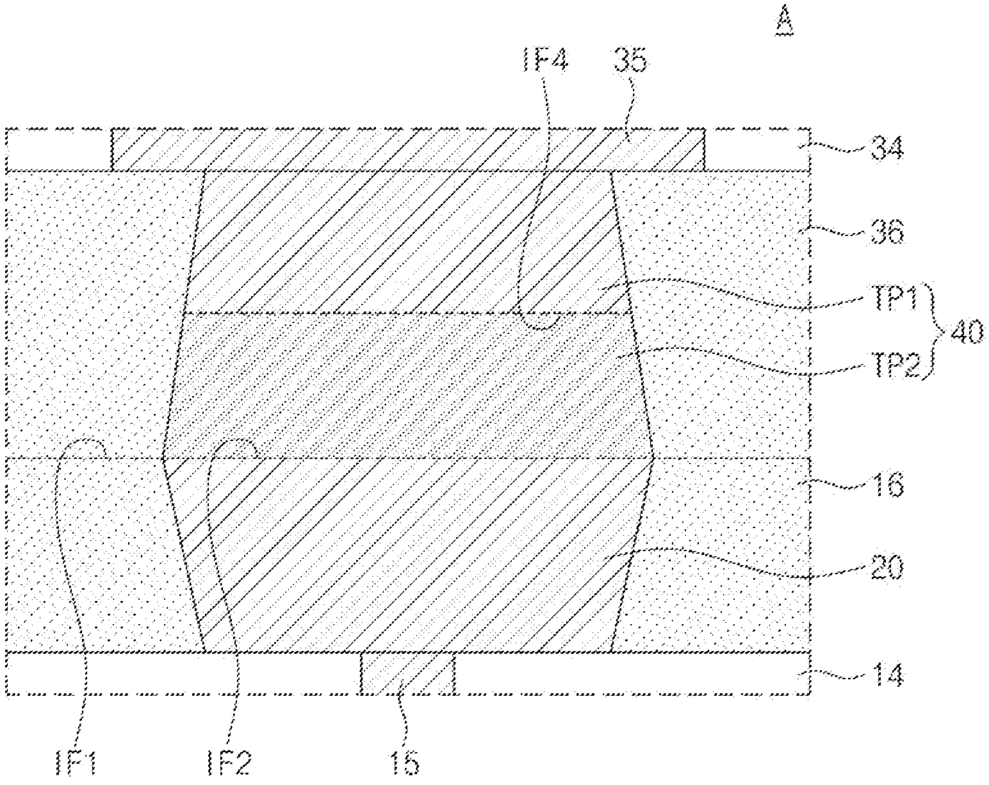
Figure 7:
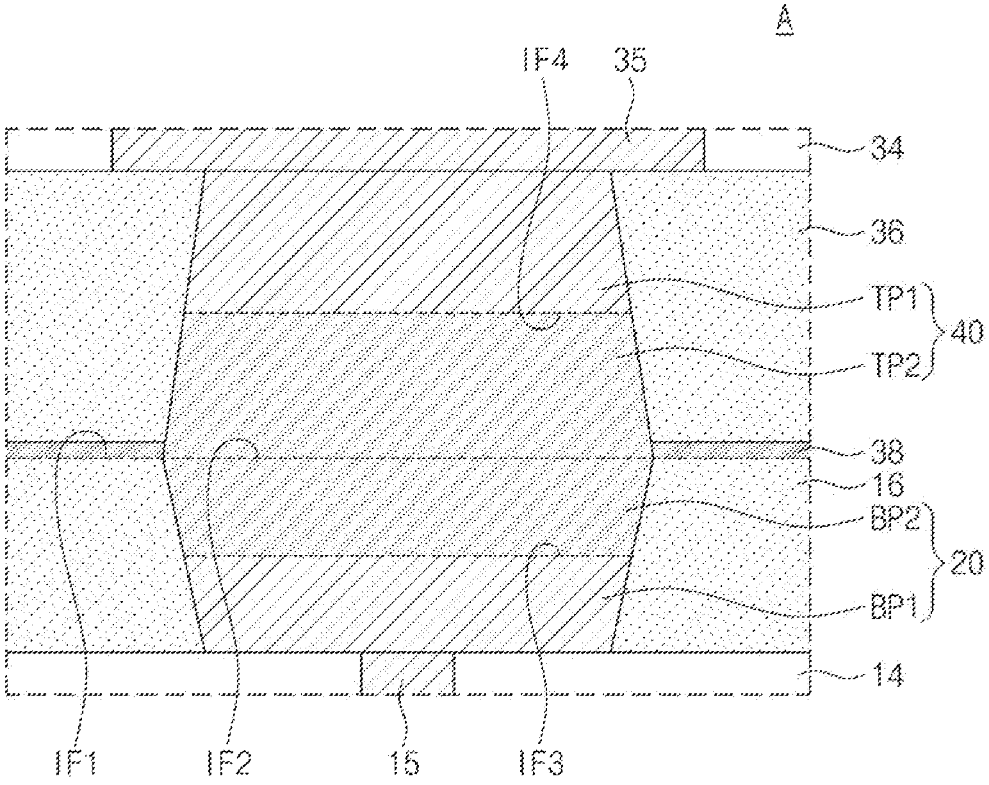

FIGS. 5 to 7 are enlarged sectional views, each of which illustrates a portion (e.g., A of FIG. 1) of a semiconductor device according to example embodiments of the inventive concept.

In the following description, an element previously described with reference to FIGS. 1 to 4 may be identified by the same reference number without repeating an overlapping description thereof, for concise description.

Referring to FIG. 5, the second portion TP2 (e.g., the second portion TP2 of FIG. 4) may be omitted from the second pad 40. By contrast, the first pad 20 may include the first and second portions BP1 and BP2. The second portion BP2 of the first pad 20 may be in contact with the second pad 40. For example, a top surface of the second portion BP2 of the first pad 20 may be substantially the same shape as a bottom surface of the second pad 40. The second interface IF2 may be placed between the second portion BP2 of the first pad 20 and the second pad 40. The first interface IF1 may be placed between the first and second insulating layers 16 and 36. The first interface IF1 may be coplanar with the second interface IF2. Although not illustrated in the drawings, the second interface IF2 may not be coplanar with the first interface IF1. For example, the second interface IF2 may be located at a level that is lower or higher than the first interface IF1.

Referring to FIG. 6, the second portion BP2 (e.g., the second portion BP2 of FIG. 4) may be omitted from the first pad 20. By contrast, the second pad 40 may include the first and second portions TP1 and TP2. The second portion TP2 of the second pad 40 may be in contact with the first pad 20. For example, a bottom surface of the second portion TP2 of the second pad 40 may be substantially the same shape as a top surface of the first pad 20. The second interface IF2 may be located between the second portion TP2 of the second pad 40 and the first pad 20. The first interface IF1 may be placed between the first and second insulating layers 16 and 36. The first interface IF1 may be coplanar with the second interface IF2. Although not illustrated in the drawings, the second interface IF2 may not be coplanar with the first interface IF1. For example, the second interface IF2 may be located at a level that is lower or higher than the first interface IF1.

Referring to FIG. 7, the upper structure 30 may further include an upper protection layer 38. The upper protection layer 38 may be provided on a bottom surface of the second insulating layer 36 to conformally cover the second insulating layer 36. For example, the upper protection layer 38 may cover the bottom surface of the second insulating layer 36. The upper protection layer 38 may contact the bottom surface of the second insulating layer 36 and a side surface of the second portion TP2 of the second pads 40. The upper protection layer 38 may be provided to expose the second pads 40. The upper protection layer 38 may be formed of or may include the same material as the first insulating layer 16. The upper protection layer 38 may be formed of or may include at least one of insulating materials (e.g., silicon oxide (SiO), silicon nitride (SiN), silicon oxynitride (SiON), or silicon carbon nitride (SiCN)). The second insulating layer 36 may be formed of or may include a material that is the same as or different from the first insulating layer 16.

At the interface between the lower and upper structures 10 and 30, the first insulating layer 16 of the lower structure 10 may be bonded to the upper protection layer 38 of the upper structure 30. Here, the first insulating layer 16 and the upper protection layer 38 may form a hybrid bonding structure of oxide, nitride, or oxynitride. For example, the first insulating layer 16 and the upper protection layer 38, which are bonded to each other, may have a continuous structure, and the first interface IF1 between the first insulating layer 16 and the upper protection layer 38 may not be visible. For example, the first insulating layer 16 and the upper protection layer 38 may be formed of the same material, and in this case, there may be no interface between the first insulating layer 16 and the upper protection layer 38. For example, the first insulating layer 16 and the upper protection layer 38 may be provided as a single element. For example, the first insulating layer 16 and the upper protection layer 38 may be bonded to each other to form a single object.

Figure 8:
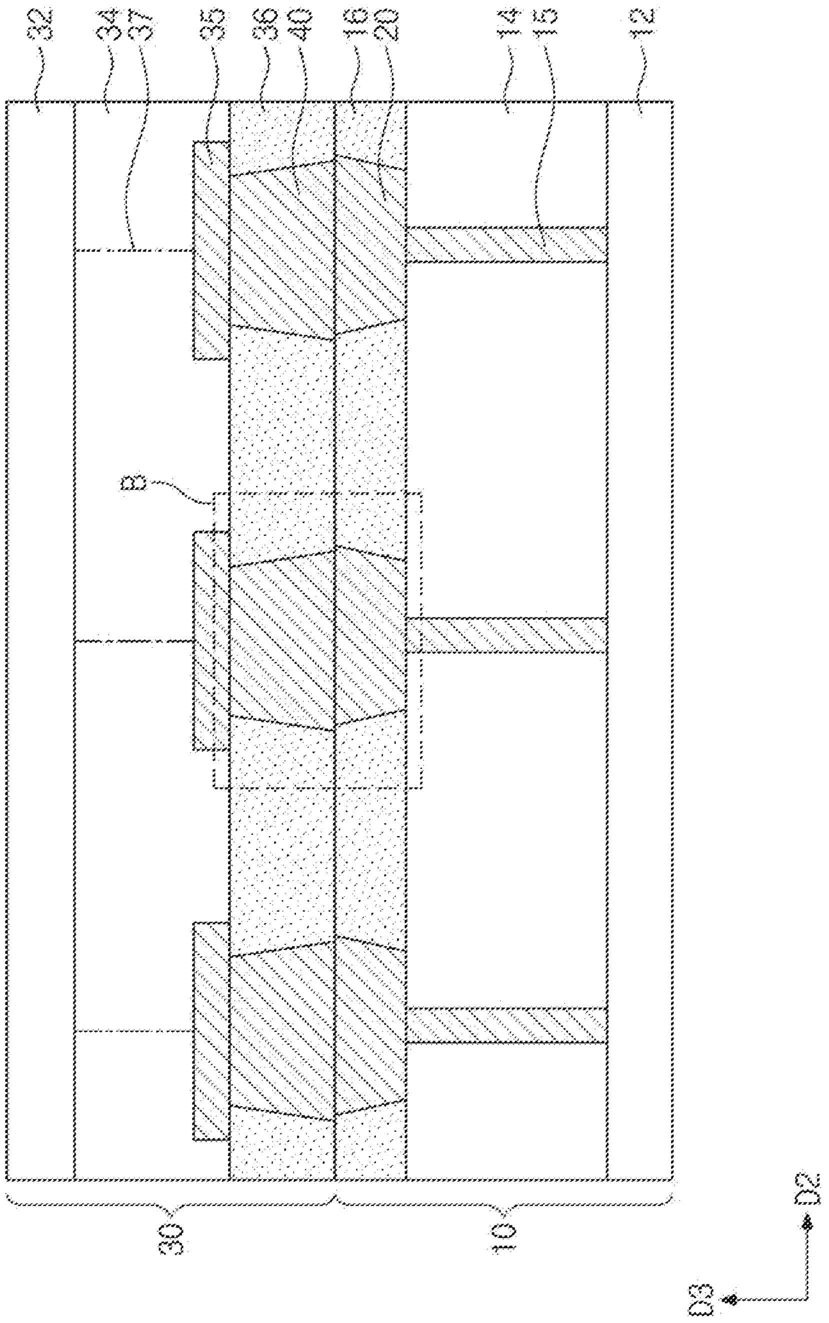
FIG. 8 is a sectional view illustrating a semiconductor device, according to an example embodiment of the inventive concept.
Figure 9:
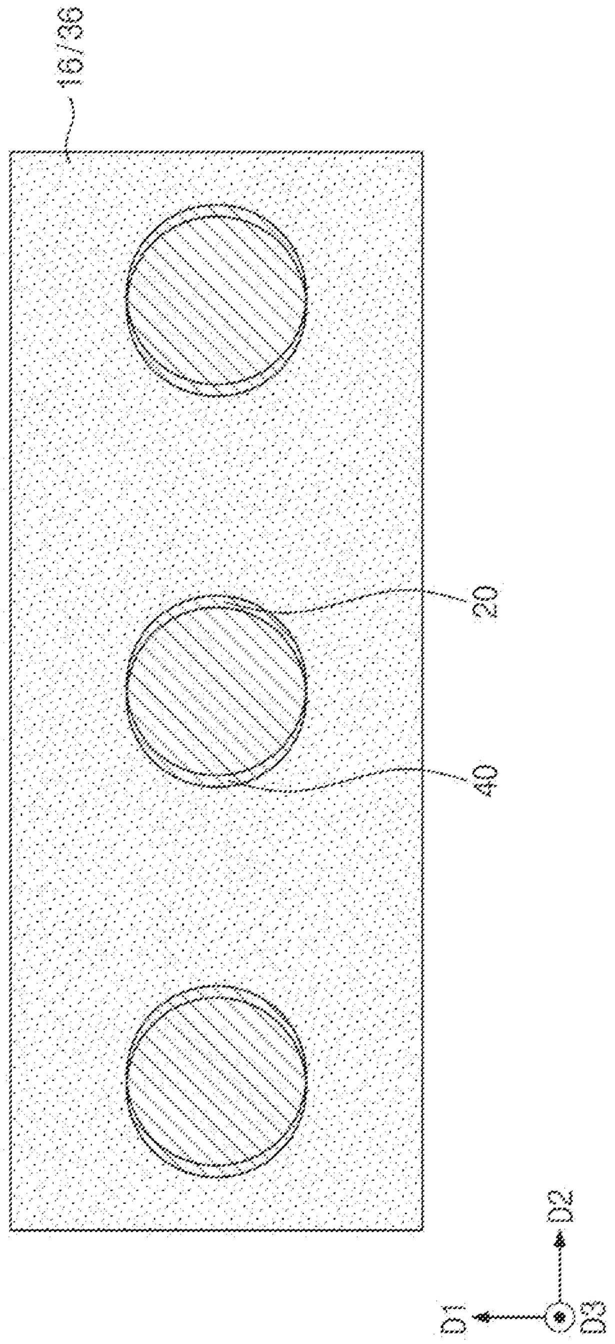
FIG. 9 is a plan view illustrating a semiconductor device, according to an example embodiment of the inventive concept.
Figure 10:
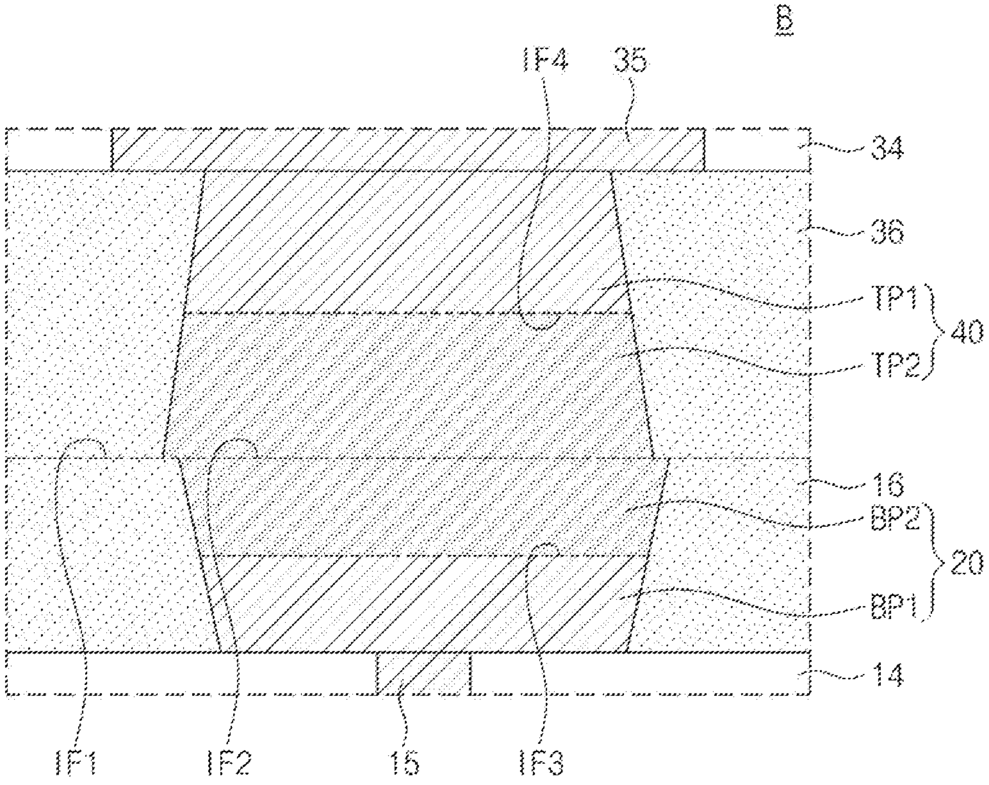
FIG. 10 is an enlarged sectional view illustrating a portion B of FIG. 8.

FIG. 8 is a sectional view illustrating a semiconductor device according to an example embodiment of the inventive concept. FIG. 9 is a plan view illustrating a semiconductor device according to an example embodiment of the inventive concept. FIG. 10 is an enlarged sectional view illustrating a portion B of FIG. 8.

In the following description, an element previously described with reference to FIGS. 1 to 4 may be identified by the same reference number without repeating an overlapping description thereof, for concise description.

Referring to FIGS. 8 to 10, the upper structure 30 may be disposed on the lower structure 10. Here, the first pads 20 of the lower structure 10 and the second pads 40 of the upper structure 30 may be partially aligned to each other in a vertical direction. For example, the first and second pads 20 and 40 may be shifted from each other in a horizontal direction. The lower and upper structures 10 and 30 may be in contact with each other such that the first and second pads 20 and 40 are connected to each other. For example, portions of the first and second pads 20 and 40 may contact each other.

A portion of the second portion BP2 of the first pad 20 may be in contact with the second insulating layer 36. A portion of the second portion TP2 of the second pad 40 may be in contact with the first insulating layer 16. Since the second portions BP2 and TP2 of the first and second pads 20 and 40 include a material different from the first and second insulating layers 16 and 36, a hybrid bonding structure may not be formed. For example, the first and/or second interfaces IF1 and IF2, at which the second portions BP2 and TP2 of the first and second pads 20 and 40 are in partial contact with the first and second insulating layers 16 and 36, may be visible.

Figure 11:
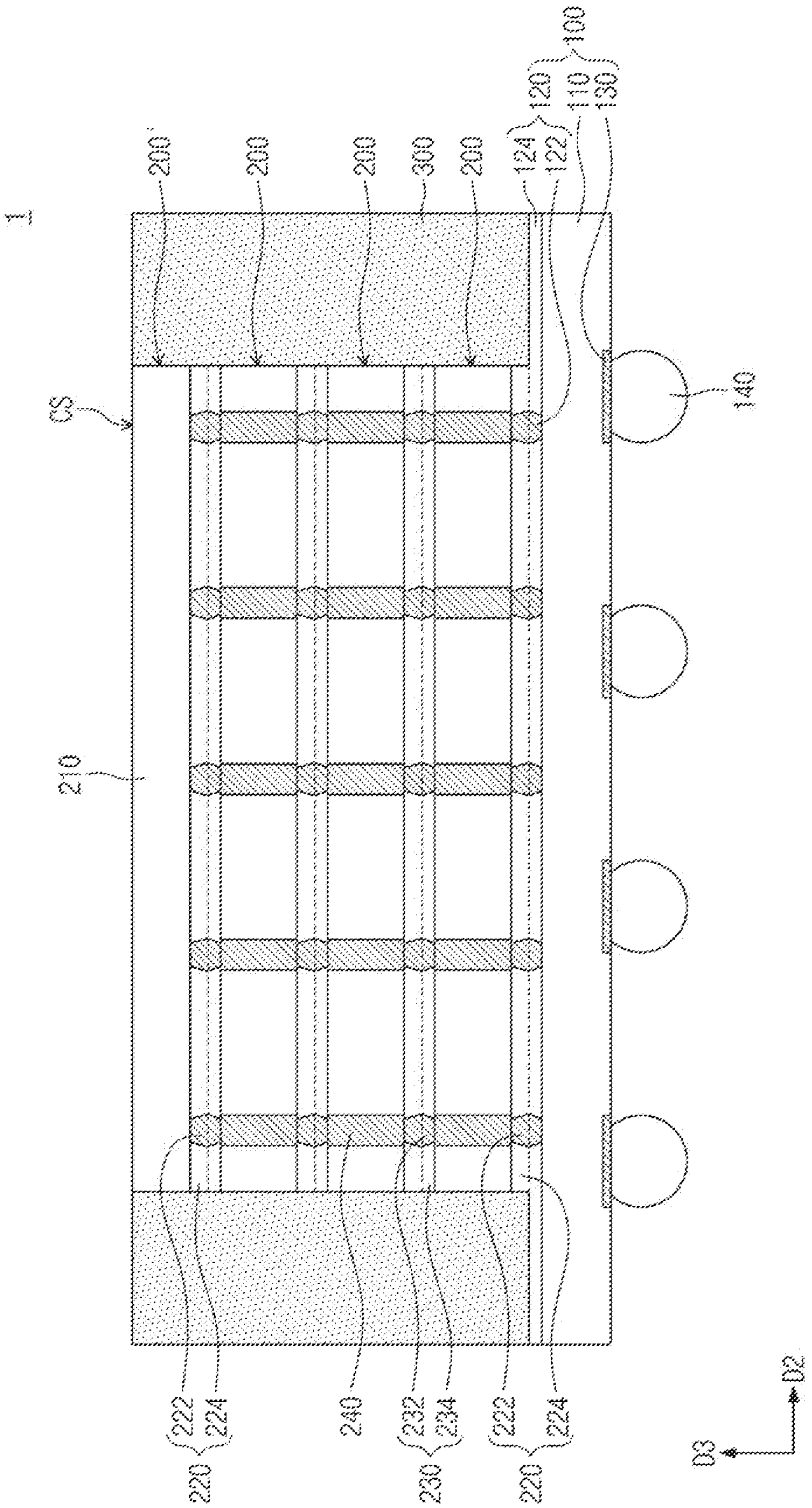
FIG. 11 is a sectional view illustrating a semiconductor device, according to an example embodiment of the inventive concept.

FIG. 11 is a sectional view illustrating a semiconductor device according to an example embodiment of the inventive concept.

Referring to FIG. 11, a substrate 100 may be provided. The substrate 100 may be a package substrate (e.g., a printed circuit board (PCB)) or an interposer substrate, which is provided in a package. In an embodiment, the substrate 100 may be a semiconductor substrate, on which semiconductor elements are formed or integrated. The substrate 100 may include a substrate base layer 110 and a substrate interconnection layer 120 thereon.

The substrate interconnection layer 120 may include first substrate pads 122, which are exposed to the outside of the substrate base layer 110 near a top surface of the substrate base layer 110, and a substrate protection layer 124, which is provided to cover the substrate base layer 110 and to enclose the first substrate pads 122. For example, the substrate protection layer 124 may completely surround and contact side surfaces of the first substrate pads 122. Here, a top surface of the first substrate pads 122 may be coplanar with a top surface of the substrate protection layer 124. Second substrate pads 130 may be disposed near a bottom surface of the substrate base layer 110 and may be exposed to the outside of the substrate base layer 110. In an embodiment, the substrate 100 may include a redistribution structure for a chip stack CS, which will be described below. For example, the first substrate pads 122 and the second substrate pads 130 may be electrically connected to each other through circuit interconnection lines, which are provided in the substrate base layer 110, and in an embodiment, the first and second substrate pads 122 and 130, in conjunction with the circuit interconnection lines, may constitute a redistribution circuit. The first substrate pads 122 and the second substrate pads 130 may be formed of or may include at least one of conductive materials (e.g., metallic materials). For example, the first substrate pads 122 and the second substrate pads 130 may be formed of or may include copper (Cu). The substrate protection layer 124 may be formed of or may include at least one of insulating materials (e.g., oxide, nitride, or oxynitride materials), which include an element that is contained in the substrate base layer 110. For example, the substrate protection layer 124 may be formed of or may include at least one of silicon oxide (SiO), silicon nitride (SiN), or silicon oxynitride (SiON).

Substrate connection terminals 140 may be disposed on a bottom surface of the substrate 100. The substrate connection terminals 140 may be provided on the second substrate pads 130 of the substrate 100. For example, the substrate connection terminals 140 may contact the second substrate pads 130. The substrate connection terminals 140 may include solder balls, solder bumps, or the like. Depending on the kind and arrangement of the substrate connection terminals 140, a semiconductor device 1 may be provided in the form of a ball grid array (BGA), a fine ball grid array (FBGA), or a land grid array (LGA).

The chip stack CS may be disposed on the substrate 100. The chip stack CS may include at least one semiconductor chip 200 or 200', which is stacked on the substrate 100. Each of the semiconductor chips 200 and 200' may be one of memory chips, such as DRAM, SRAM, MRAM, or FLASH memory chips. In an embodiment, each of the semiconductor chips 200 and 200' may be a logic chip. Although FIG. 11 illustrates an example, in which one chip stack CS is disposed, the inventive concept is not limited to this example. In the case where a plurality of chip stacks CS are provided, the chip stacks CS may be spaced apart from each other, on the substrate 100.

One semiconductor chip 200 may be mounted on the substrate 100. The semiconductor chip 200 may be formed of or may include a semiconductor material (e.g., silicon (Si)).

The semiconductor chip 200 may include a chip base layer 210, a first chip interconnection layer 220, which is disposed on a surface of the chip base layer 210 near a front surface of the semiconductor chip 200, and a second chip interconnection layer 230, which is disposed on a surface of the chip base layer 210 near a rear surface of the semiconductor chip 200. Hereinafter, in the present specification, the front surface may be a surface of a semiconductor chip, which is called an active surface, and on which integrated devices or pads are formed, and the rear surface may be another surface of a semiconductor chip that is opposite to the front surface.

The first chip interconnection layer 220 may include first chip pads 222, which are provided on the chip base layer 210, and a first chip protection layer 224, which is provided on the chip base layer 210 to enclose the first chip pads 222. For example, the first chip protection layer 224 may completely surround and contact side surfaces of the first chip pads 222. The first chip pads 222 may be electrically connected to integrated elements or integrated circuits in the semiconductor chip 200. In an embodiment, wires, which are used as a part of a redistribution structure, may be provided between the first chip pads 222 and the integrated elements in the semiconductor chip 200. The first chip pads 222 may be formed of or may include at least one of conductive materials (e.g., metallic materials). For example, the first chip pads 222 may be formed of or may include copper (Cu). The first chip protection layer 224 may be formed of or may include at least one of insulating materials. For example, the first chip protection layer 224 may be formed of or may include at least one of silicon oxide (SiO), silicon nitride (SiN), or silicon oxynitride (SiON).

The second chip interconnection layer 230 may include second chip pads 232, which are provided on the chip base layer 210, and a second chip protection layer 234, which is provided on the chip base layer 210 to enclose the second chip pads 232. For example, the second chip protection layer 234 may completely surround and contact side surfaces of the second chip pads 232. The second chip pads 232 may be electrically connected to the first chip interconnection layer 220. In an embodiment, the second chip pads 232 may be connected to the first chip interconnection layer 220 through penetration electrodes 240, which are provided to vertically penetrate the chip base layer 210. The second chip pads 232 may be formed of or may include at least one of conductive materials (e.g., metallic materials). For example, the second chip pads 232 may be formed of or may include copper (Cu). The second chip protection layer 234 may be formed of or may include at least one of insulating materials. For example, the second chip protection layer 234 may be formed of or may include at least one of silicon oxide (SiO), silicon nitride (SiN), or silicon oxynitride (SiON).

The semiconductor chip 200 may be mounted on the substrate 100. As shown in FIG. 11, the semiconductor chip 200 may be placed such that the front surface thereof faces the substrate 100, and the semiconductor chip 200 may be electrically connected to the substrate 100. Here, the front surface of the semiconductor chip 200 (i.e., a bottom surface of the first chip interconnection layer 220) may be in contact with a top surface of the substrate 100. For example, the first chip pads 222 of the semiconductor chip 200 may be in contact with the first substrate pads 122 of the substrate 100, and the first chip protection layer 224 may be in contact with the substrate protection layer 124 of the substrate 100.

In an embodiment, a plurality of semiconductor chips 200 may be provided. For example, one of the semiconductor chips 200 (hereinafter, a first semiconductor chip 200) may be mounted on another of the semiconductor chips 200 (hereinafter, a second semiconductor chip 200). The first semiconductor chip 200 may be disposed such that a front surface thereof faces the second semiconductor chip 200. Here, the front surface of the first semiconductor chip 200 may be in contact with a rear surface of the second semiconductor chip 200. For example, the first chip interconnection layer 220 of the first semiconductor chip 200 may be in contact with the second chip interconnection layer 230 of the second semiconductor chip 200. In more detail, the semiconductor chips 200 may be stacked such that the first chip protection layer 224 is in contact with the second chip protection layer 234 and the first chip pads 222 are in contact with the second chip pads 232.

The second chip pads 232 may correspond to the first pads 20 described with reference to FIGS. 1 to 10, and the first chip pads 222 may correspond to the second pads 40 described with reference to FIGS. 1 to 10. For example, the first chip pads 222 and the second chip pads 232 may be bonded to each other, and the first chip protection layer 224 and the second chip protection layer 234 may be bonded to each other. The first chip pads 222 and the second chip pads 232 may form an intermetal hybrid bonding structure. The first chip protection layer 224 and the second chip protection layer 234 may form a hybrid bonding structure. The semiconductor chips 200 may be electrically connected to each other through the first chip pads 222 and the second chip pads 232. In an embodiment, a plurality of the semiconductor chips 200 and 200' may be stacked on the substrate 100.

The semiconductor chip 200', which is the topmost one of the semiconductor chips 200 and 200' of the chip stack CS, may have a structure that is slightly different from the remaining semiconductor chips 200. For example, the topmost semiconductor chip 200' may not have the second chip interconnection layer 230 and the penetration electrodes 240.

A mold layer 300 may be provided on the substrate 100. The mold layer 300 may cover the top surface of the substrate 100. The mold layer 300 may be provided to enclose the chip stack CS. For example, the mold layer 300 may cover side surfaces of the semiconductor chips 200. The mold layer 300 may protect the chip stack CS. The mold layer 300 may be formed of or may include at least one of insulating materials. For example, the mold layer 300 may be formed of or may include epoxy molding compound (EMC). In an embodiment, the mold layer 300 may be formed to cover the chip stack CS, unlike the illustrated structure. For example, the mold layer 300 may cover the rear surface of the uppermost semiconductor chip 200'.

Although the semiconductor chips 200 are illustrated to be mounted on the substrate 100, the inventive concept is not limited to this example. In another embodiment, the semiconductor chips 200 may be mounted on a base semiconductor chip. The base semiconductor chip may be a wafer-level semiconductor substrate that is formed of a silicon semiconductor material. The base semiconductor chip may include an integrated circuit. For example, the integrated circuit may be a memory circuit, a logic circuit, or combinations thereof.

Figure 12:
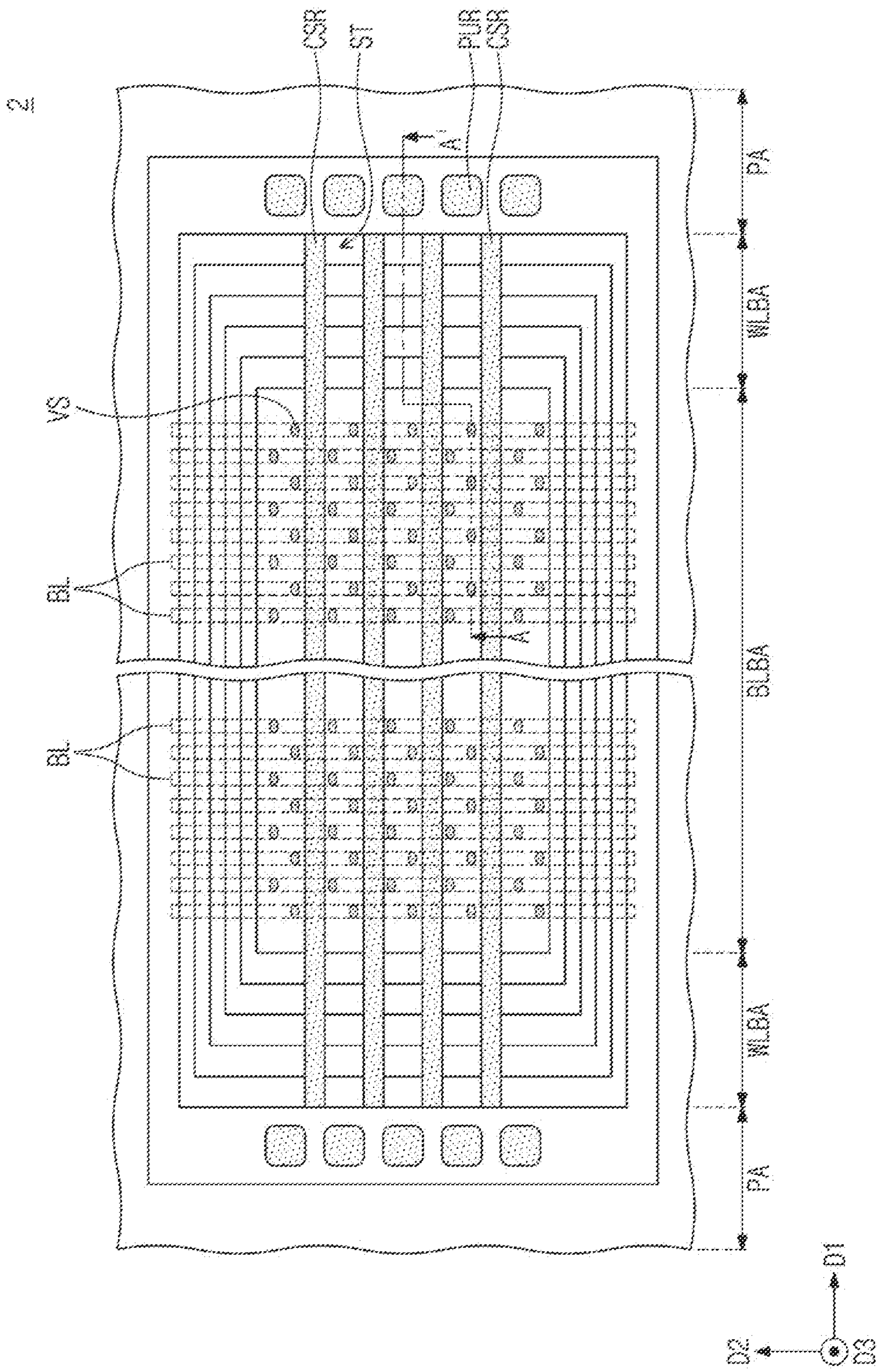
FIG. 12 is a plan view illustrating a semiconductor device, according to an example embodiment of the inventive concept.
Figure 13:
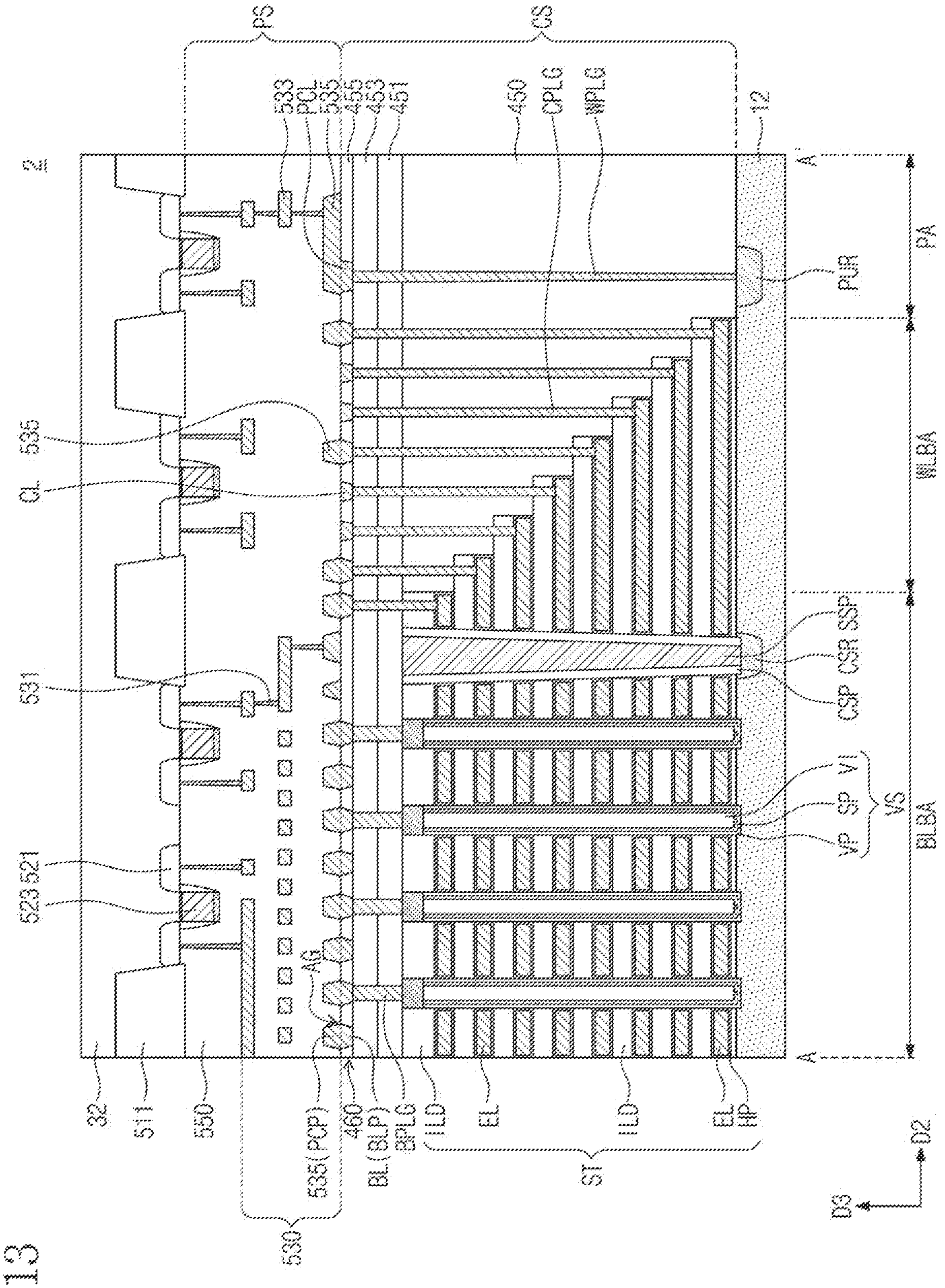
FIG. 13 is a sectional view taken along a line A-A' of FIG. 12 to illustrate a semiconductor device, according to an example embodiment of the inventive concept.

FIG. 12 is a plan view illustrating a semiconductor device according to an example embodiment of the inventive concept. FIG. 13 is a sectional view taken along a line A-A' of FIG. 12 to illustrate a semiconductor device according to an example embodiment of the inventive concept.

Referring to FIGS. 12 and 13, a semiconductor device 2 may be a memory device. The semiconductor device 2 may be provided to have a chip-to-chip (C2C) structure. In the C2C structure, an upper chip including a cell array structure CS may be fabricated on a first wafer, a lower chip including a peripheral circuit structure PS may be fabricated on a second wafer different from the first wafer, and the upper chip and the lower chip may be connected to each other through a bonding method. The bonding method may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding method may be a Cu-to-Cu bonding method, but in an example embodiment, aluminum (Al) or tungsten (W) may be used as the bonding metal.

Each of the cell array structure CS and the peripheral circuit structure PS of the semiconductor device 2 may include an outer pad bonding region PA, a word line bonding region WLBA, and a bit line bonding region BLBA.

The first substrate 12 may be provided. The first substrate 12 may be formed of a semiconductor material and, for example, may be a silicon (Si) substrate, a silicon-germanium (Si—Ge) substrate, a germanium (Ge) substrate, or a substrate including a single crystalline silicon substrate and a single crystalline epitaxial layer grown thereon. As an example, the first substrate 12 may be a silicon wafer. In an embodiment, the first substrate 12 may be formed of or may include a doped semiconductor material of a first conductivity type (e.g., p-type) and/or an undoped or intrinsic semiconductor material.

The cell array structure CS may be provided on the first substrate 12 and may include stacks ST, vertical structures VS, and interconnection structures CPLG, CL, WPLG, and PCL. In an embodiment, the first substrate 12 and the cell array structure CS may correspond to the lower structure 10 described with reference to FIG. 1, and a portion of the cell array structure CS may correspond to the first circuit layer 14.

The stacks ST may be provided on the first substrate 12 to extend lengthwise in a first direction D1 and may be arranged to be spaced apart from each other in a second direction D2. Each of the stacks ST may include electrodes EL, which are vertically stacked on the first substrate 12, and insulating layers ILD, which are interposed between the electrodes EL. In the stacks ST, a thickness of each of the insulating layers ILD may be changed, depending on technical requirements for the semiconductor memory device. As an example, at least one of the insulating layers ILD may be thicker than the others. The insulating layers ILD may be formed of or may include silicon oxide (SiO). Each of the electrodes EL may be formed of or may include at least one of conductive materials and may include at least one of a semiconductor layer, a metal silicide layer, a metal layer, a metal nitride layer, or combinations thereof.

The stacks ST may be extended from the bit line bonding region BLBA to the word line bonding region WLBA in the first direction D1 and may have a stepwise structure in the word line bonding region WLBA. Lengths of the electrodes EL of the stacks ST in the first direction D1 may decrease as a distance from the first substrate 12 increases. The stepwise structure of the stacks ST in the word line bonding region WLBA may be variously changed.

In an embodiment, the semiconductor device may be a three-dimensional NAND FLASH memory device, and cell strings may be integrated on the first substrate 12. In this case, the lowermost and uppermost ones of the electrodes EL in the stacks ST may be used as gate electrodes of selection transistors. For example, the uppermost one of the electrodes EL may be used as a gate electrode of a string selection transistor controlling an electric connection between a bit line BL and the vertical structures VS, and the lowermost one of the electrodes EL may be used as a gate electrode of a ground selection transistor controlling an electric connection between a common source line and the vertical structures VS. The remaining ones of the electrodes EL between the uppermost and lowermost electrodes may be used as control gate electrodes of memory cells and word lines connecting the control gate electrodes.

In the bit line bonding region BLBA, the vertical structures VS may be provided to penetrate the stacks ST and to be in contact with the first substrate 12. The vertical structures VS may be electrically connected to the first substrate 12. The vertical structures VS may be arranged in a specific direction or may be arranged in a zigzag shape, when viewed in a plan view. Furthermore, dummy vertical structures (not shown) may be provided in the word line bonding region WLBA or the outer pad bonding region PA to have substantially the same structure as the vertical structures VS.

The vertical structures VS may include a semiconductor material (e.g., silicon (Si) or germanium (Ge)). In addition, the vertical structures VS may include a doped semiconductor material or an intrinsic semiconductor material. The vertical structures VS including the semiconductor material may be used as channel regions of selection transistors and memory cell transistors. Bottom surfaces of the vertical structures VS may be located between the top and bottom surfaces of the first substrate 12. A contact pad may be provided on the vertical structure VS or in an upper portion of the vertical structure VS and may be connected to a bit line contact plug BPLG.

Each of the vertical structures VS may include a semiconductor pattern SP and a vertical insulating pattern VP, which are in contact with the first substrate 12. The semiconductor pattern SP may have a hollow pipe shape or a macaroni shape. In an embodiment, the semiconductor pattern SP may have a bottom end of a closed shape, and an inner space of the semiconductor pattern SP may be filled with a gapfill insulating pattern VI. The semiconductor pattern SP may be in contact with a top surface of the first substrate 12. The semiconductor pattern SP may be in an undoped or intrinsic state or may be doped to have the same conductivity type as the first substrate 12. At least a portion of the semiconductor pattern SP may have a polycrystalline or single crystalline structure.

The vertical insulating pattern VP may be disposed between the stack ST and the vertical structures VS. The vertical insulating pattern VP may be extended in the third direction D3 and may enclose a side surface of the vertical structure VS. For example, the vertical insulating pattern VP may be shaped like a hollow pipe or macaroni with open top and bottom. The vertical insulating pattern VP may include one or more layers. In an embodiment, the vertical insulating pattern VP may be a part of a data storing layer. For example, the vertical insulating pattern VP may include a tunnel insulating layer, a charge storing layer, and a blocking insulating layer, which are used as a data storing layer of a NAND FLASH memory device. For example, the charge storing layer may be a trap insulating layer, a floating gate electrode, or an insulating layer including conductive nanodots. In more detail, the charge storing layer may include at least one of a silicon nitride layer, a silicon oxynitride layer, a silicon-rich nitride layer, a nanocrystalline silicon layer, or a laminated trap layer. The tunnel insulating layer may be formed of at least one of materials, whose band gaps are greater than that of the charge storing layer, and the blocking insulating layer may be formed of at least one of high-k dielectric materials (e.g., aluminum oxide ($Al_2O_3$) and hafnium oxide ($Hf_2O$)). In certain embodiments, the vertical insulating layer may include at least one layer (not shown) exhibiting a phase-changeable or variable resistance property.

A horizontal insulating pattern HP may be provided between a side surface of the electrode EL and the vertical insulating pattern VP. The horizontal insulating pattern HP may be extended from the side surface of the electrode EL to cover top and bottom surfaces of the electrode EL. The horizontal insulating pattern HP may be a part of the data storing layer of the NAND FLASH memory device and may include the charge storing layer and the blocking insulating layer. Alternatively, the horizontal insulating pattern HP may include the blocking insulating layer.

Common source regions CSR may be respectively disposed in portions of the first substrate 12 between adjacent ones of the stacks ST. The common source regions CSR may be extended parallel to the stacks ST or lengthwise in the first direction D1. The common source regions CSR may be formed by doping the first substrate 12 with impurities of a second conductivity type. For example, the common source regions CSR may include n-type impurities (e.g., arsenic (As) or phosphorus (P)).

A common source plug CSP may be connected to the common source region CSR. An insulating sidewall spacer SSP may be interposed between the common source plug CSP and the stacks ST. During the read or program operations of the three-dimensional NAND FLASH memory device, a ground voltage may be applied to the common source region CSR through the common source plug CSP.

A first insulating gapfill layer 450 may be provided on the first substrate 12 to cover end portions of the electrodes EL, which are provided in the stepwise shape. A first interlayer insulating layer 451 may be provided to cover top surfaces of the vertical structures VS, and a second interlayer insulating layer 453 may be provided on the first interlayer insulating layer 451 to cover a top surface of the common source plug CSP. The first interlayer insulating layer 451 may contact the top surfaces of the vertical structures VS, the common source plug CSP, and the first insulating gapfill layer 450, and the second interlayer insulating layer 453 may contact the top surface of the first interlayer insulating layer 451.

The bit lines BL may be disposed on the second interlayer insulating layer 453 and may be extended in the second direction D2 to cross the stacks ST. The bit line BL may be electrically connected to the vertical structure VS through the bit line contact plug BPLG. The bit lines BL may correspond to pads, which are used for an electric connection with the peripheral circuit structure PS. The bit lines BL may include bit line pads BLP. The bit line pads BLP may be provided to have substantially the same or similar features as the first pads 20 described with reference to FIGS. 1 to 10. For example, the bit line pads BLP may correspond to the first pads 20 described with reference to FIGS. 1 to 10.

An interconnection structure may be disposed to electrically connect the peripheral circuit structure PS to end portions of the stacks ST having the stepwise structure. The interconnection structure may include cell contact plugs CPLG, which are provided to penetrate the first insulating gapfill layer 450 and the first and second interlayer insulating layers 451 and 453 and are respectively connected to the end portions of the electrodes EL, and connection lines CL, which are provided on the second interlayer insulating layer 453 and are respectively connected to the cell contact plugs CPLG. In addition, the interconnection structure may include well contact plugs WPLG, which are connected to well pick-up regions PUR in the first substrate 12, and peripheral connection lines PCL, which are connected to the well contact plugs WPLG. The bit lines BL, the connection lines CL, and the peripheral connection lines PCL may constitute a cell array interconnection layer 460.

The well pick-up regions PUR may be disposed in the first substrate 12 and adjacent to opposite end portions of each of the stacks ST. The well pick-up regions PUR may have the same conductivity type as the first substrate 12, and an impurity concentration of the well pick-up regions PUR may be higher than an impurity concentration of the first substrate 12. For example, the well pick-up regions PUR may include a high concentration of p-type impurities (e.g., boron (B)). In an embodiment, during an erase operation of the three-dimensional NAND FLASH memory device, an erase voltage may be applied to the well pick-up regions PUR through a connection contact plug PPLG and the well contact plug WPLG.

A third interlayer insulating layer 455 may be provided on the second interlayer insulating layer 453 to enclose the bit lines BL, the connection lines CL, and the peripheral connection lines PCL. For example, the third interlayer insulating layer 455 may completely surround and contact side surfaces of the bit lines BL, the connection lines CL, and the peripheral connection lines PCL. The third interlayer insulating layer 455 may be formed to expose top surfaces of the bit line pads BLP, top surfaces of the connection lines CL, and top surfaces of the peripheral connection lines PCL. The third interlayer insulating layer 455 may be provided to have substantially the same or similar features as the first insulating layer 16 described with reference to FIGS. 1 to 10. For example, the third interlayer insulating layer 455 may correspond to the first insulating layer 16 described with reference to FIGS. 1 to 10. The bit lines BL, the connection lines CL, and the peripheral connection lines PCL may constitute the cell array interconnection layer 460. The bit lines BL, the connection lines CL, and the peripheral connection lines PCL may correspond to pads of the cell array structure CS, which are electrically connected to the peripheral circuit structure PS.

As described above, the cell array structure CS may be disposed on the first substrate 12. The peripheral circuit structure PS may be disposed on the cell array structure CS.

The second substrate 32 may be provided. The second substrate 32 may be a silicon substrate, a silicon-germanium substrate, a germanium substrate, or a single-crystalline epitaxial layer grown on a single-crystalline silicon substrate. As an example, the second substrate 32 may be a silicon substrate of a first conductivity type (e.g., p-type) and may include well regions.

The peripheral circuit structure PS may include peripheral circuits, which are integrated on a front surface of the second substrate 32, and a second insulating gapfill layer 550, which is provided to cover the peripheral circuits. As an example, the second substrate 32 and the peripheral circuit structure PS may correspond to the upper structure 30 described with reference to FIG. 1, and a portion of the peripheral circuit structure PS may correspond to the second circuit layer 34.

The peripheral circuits may include row and column decoders, a page buffer, and a control circuit, which are composed of NMOS and PMOS transistors, low- and high-voltage transistors, and/or resistors that are integrated on the second substrate 32. In detail, the peripheral circuits may include a pre-charge control circuit, which is used to control data program steps on a plurality of memory cells and to control some of cell strings. In more detail, a device isolation layer 511 may be formed in the second substrate 32 to define active regions. Peripheral gate electrodes 523 may be disposed on the active region of the second substrate 32 with a gate insulating layer interposed therebetween. Source/drain regions 521 may be provided in portions of the second substrate 32, which are located at both sides of the peripheral gate electrodes 523.

A peripheral interconnection layer 530 may be connected to peripheral circuits on the second substrate 32. The peripheral interconnection layer 530 may include peripheral interconnection lines 533 and peripheral contact plugs 531. The peripheral interconnection lines 533 may be electrically connected to the peripheral circuits through the peripheral contact plugs 531. For example, the peripheral contact plugs 531 and the peripheral interconnection lines 533 may be connected to the NMOS and PMOS transistors.

The second insulating gapfill layer 550 may cover the peripheral gate electrodes 523, the peripheral contact plugs 531, and the peripheral interconnection lines 533. The peripheral interconnection layer 530 may further include exposed interconnection lines 535, which are exposed to the outside of the second insulating gapfill layer 550 near a bottom surface of the second insulating gapfill layer 550. The exposed interconnection lines 535 may be used as pads electrically connecting the peripheral circuit structures PS to the cell array structure CS. The exposed interconnection lines 535 may include peripheral circuit pads PCP. The peripheral circuit pads PCP may be provided to have the same or similar features as the second pads 40 described with reference to FIGS. 1 to 10. For example, the peripheral circuit pads PCP may correspond to the second pads 40 described with reference to FIGS. 1 to 10. For example, a width of the peripheral circuit pad PCP may be smaller than a width of the bit line pad BLP, and a thickness of the peripheral circuit pad PCP may be larger than a thickness of the bit line pad BLP. The second insulating gapfill layer 550 may include a plurality of vertically-stacked insulating layers. For example, the second insulating gapfill layer 550 may be formed of or may include at least one of silicon oxide (SiO), silicon nitride (SiN), silicon oxynitride (SiON), and/or low-k dielectric materials and may have a multi-layered structure. In an embodiment, the peripheral interconnection lines 533 and the peripheral contact plugs 531 may be formed of tungsten, which has a relatively high electric resistance, and the exposed interconnection lines 535 may be formed of copper, which has a relatively low electric resistance.

An example in which the peripheral interconnection lines 533 are provided in the form of a single layer, is only illustrated in the drawings, but the inventive concept is not limited to this example. For example, the peripheral interconnection lines 533 may be provided to form a plurality of vertically-stacked layers. Here, at least one of the peripheral interconnection lines 533 may be formed of aluminum.

The cell array structure CS and the peripheral circuit structure PS may be in direct contact with each other. For example, as shown in FIG. 13, the cell array interconnection layer 460 of the cell array structure CS and the peripheral interconnection layer 530 of the peripheral circuit structure PS may be in contact with each other. For example, the third interlayer insulating layer 455 and the second insulating gapfill layer 550 may be in direct contact with each other, and at least a portion of the bit lines BL, the connection lines CL, and the peripheral connection lines PCL may be connected to the exposed interconnection lines 535. Here, the cell array interconnection layer 460 and the peripheral interconnection layer 530 may form an intermetal hybrid bonding structure. The bit line pads BLP and the exposed interconnection lines 535 may have a continuous structure, and an interface between the bit line pad BLP and the exposed interconnection line 535 may not be visible. For example, the bit line pads BLP and the exposed interconnection lines 535 may be formed of the same material, and in this case, there may be no visible interface between the bit line pads BLP and the exposed interconnection lines 535. For example, the bit line pad BLP and the exposed interconnection line 535 may be provided as a single element. The third interlayer insulating layer 455 and the second insulating gapfill layer 550 may be bonded to each other. The third interlayer insulating layer 455 and the second insulating gapfill layer 550 may form a hybrid bonding structure.

FIGS. 14A to 14F are sectional views illustrating a method of fabricating a semiconductor device, according to an example embodiment of the inventive concept.

Figure 14A:
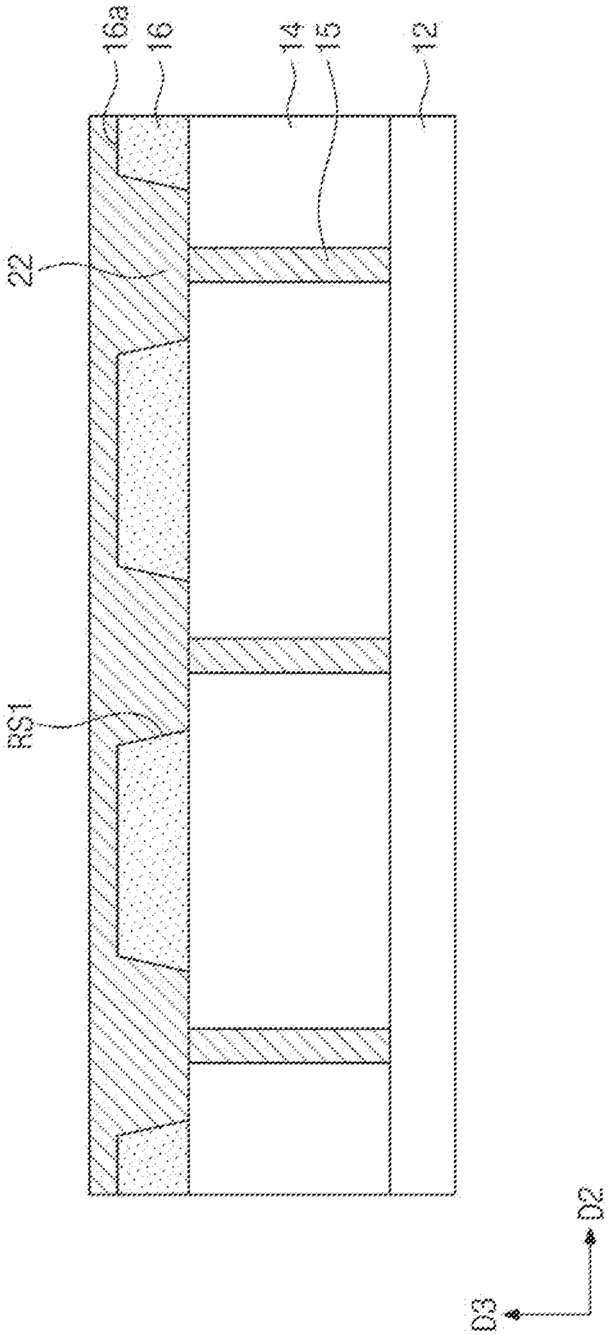
FIGS. 14A to 14F are sectional views illustrating a method of fabricating a semiconductor device, according to an example embodiment of the inventive concept.

Referring to FIG. 14A, the first substrate 12 may be provided. The first substrate 12 may be a semiconductor substrate. The first circuit layer 14 may be formed on the first substrate 12. The first circuit layer 14 may include the first connection line 15, which is used to connect the first substrate 12 to the first pads 20. The first insulating layer 16 may be formed by depositing an insulating material on the first circuit layer 14. A first recess portion RS1 may be formed by patterning the first insulating layer 16.

A first conductive layer 22 may be formed in the first recess portion RS1 and on a top surface 16*a* of the first insulating layer 16. The process of forming the first conductive layer 22 may include a plating process using a seed layer. The first conductive layer 22 may cover the top surface 16*a* of the first insulating layer 16.

Figure 14B:
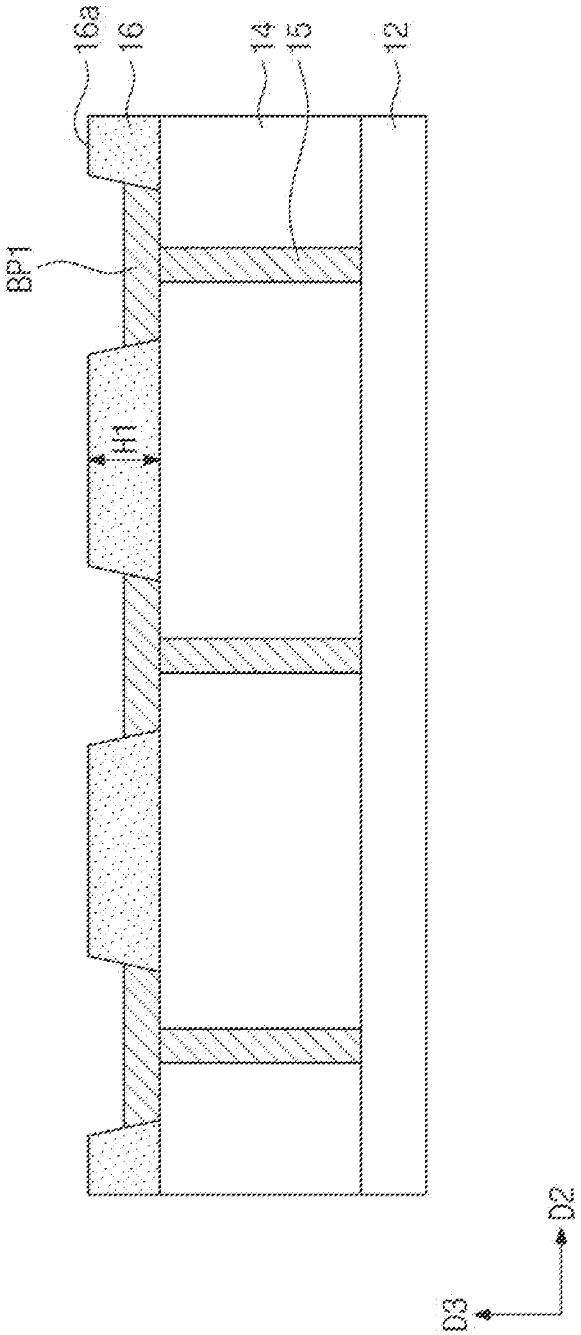

Referring to FIG. 14B, a first planarization process may be performed on the first conductive layer 22. The first planarization process may include an etch-back process and a chemical mechanical polishing (CMP) process, and in an embodiment, the first planarization process may be the CMP process. The first portions BP1 of the first pads 20 may be formed by removing an upper portion of the first conductive layer 22 through the first planarization process. In detail, the first portions BP1 of the first pads 20 may be formed by performing the first planarization process on the first conductive layer 22 in an over-etching manner. In the present specification, the over-etch manner may mean a method of further performing the process even after at least a portion of an underlying layer under a target layer is exposed, and in this case, the exposure of the underlying layer may be monitored by an end-point detection (EPD). If the over-etching process is performed for a specific time (e.g., about 60 seconds), the process may enter a CMP saturation step, in which there is no variation in height of the first portions BP1 of the first pads 20. In the CMP saturation step, the pad may no longer be etched by the CMP process. For example, if the process is in the CMP saturation step, the first portions BP1 of the first pads 20 may have a uniform height. Thus, it may be possible to improve reproducibility in the process of forming the first portions BP1 of the first pads 20.

A slurry, which is used in the first planarization process, may be chosen to have a high etch selectivity between the first conductive layer 22 and the first insulating layer 16. In this case, the first planarization process may be performed to selectively remove the first conductive layer 22 and to expose the top surface 16*a* of the first insulating layer 16. The first insulating layer 16 may have a first height H1 in the third direction D3. A height of the first portions BP1 of the first pads 20 in the third direction D3 may be smaller than the first height H1. For example, top surfaces of the first portions BP1 of the first pads 20 may be located at a level that is lower than the top surface 16*a* of the first insulating layer 16.

Although not illustrated in the drawings, a portion of the first insulating layer 16 adjacent to the first recess portion RS1 may be recessed by the first planarization process.

Figure 14C:
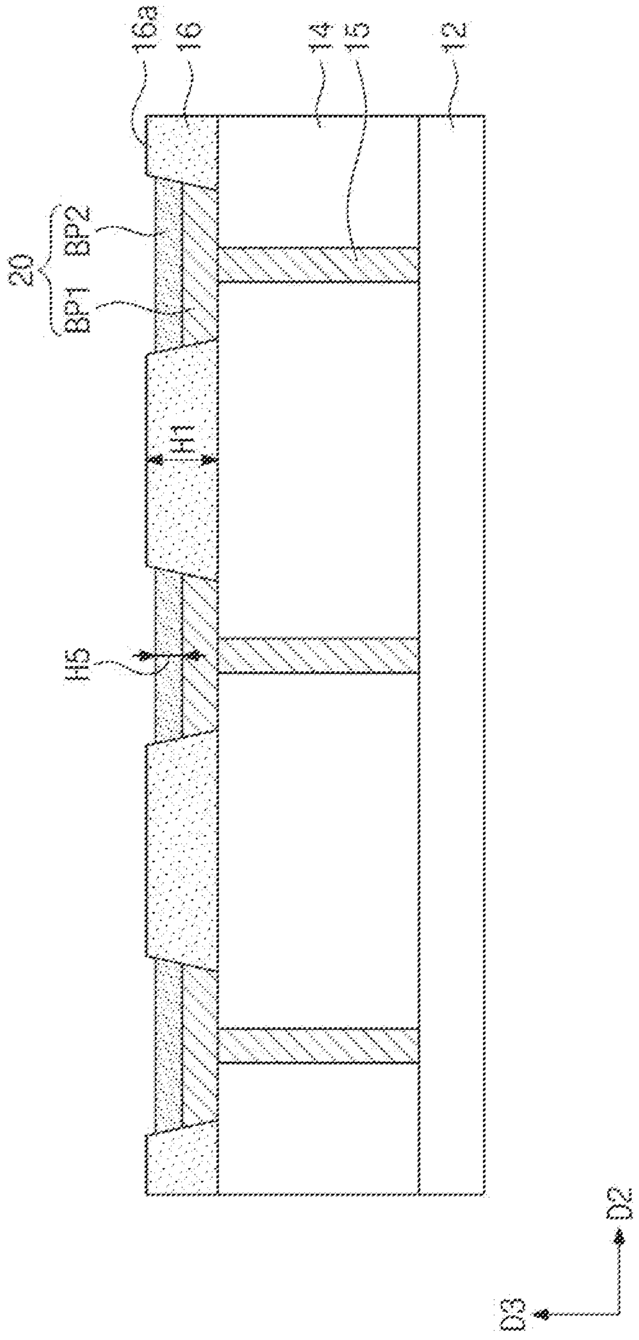

Referring to FIG. 14C, the second portions BP2 may be formed on the first portions BP1, respectively, of the first pads 20. The second portions BP2 of the first pads 20 may be formed by a selective deposition process. In this case, the second portions BP2 of the first pads 20 may be only formed in the first recess portions RS1 and on the first portions BP1 of the first pads 20, and as a result, the fabrication process may be simplified. The selective deposition process may include one of a chemical vapor deposition (CVD) process, a metal organic chemical vapor deposition (MO-CVD) process, an atomic layer deposition (ALD) process, and an electroless deposition process.

Since the second portions BP2 of the first pads 20 are formed by a deposition process, a height of the first pads 20 may be precisely controlled. For example, the first pads 20 may be formed to have a desired height, and thus, it may be possible to prevent a void from being formed in a pad or an insulating layer, after the bonding process.

According to an embodiment of the inventive concept, the first and second portions BP1 and BP2 of the first pads 20 may be formed of or may include copper (Cu). In this case, the second portions BP2 of the first pads 20 may be formed in a [111] direction. Since the thermal expansion coefficient has the highest value in the [111] direction, the first pads 20 may be in contact with the second pads 40 easily in a thermal treatment process to be described below. This may make it possible to form a high-quality bonding structure between the first and second pads 20 and 40.

The second portion BP2 of the first pad 20 may have a fifth height H5 in the third direction D3. Due to a thermal expansion of the first pad 20 in a subsequent thermal treatment process, the fifth height H5 may be smaller than the second height H2 of FIG. 4. For example, a top surface of the second portion BP2 of the first pad 20 may be located at a level that is lower than the top surface 16*a* of the first insulating layer 16.

Figure 14D:
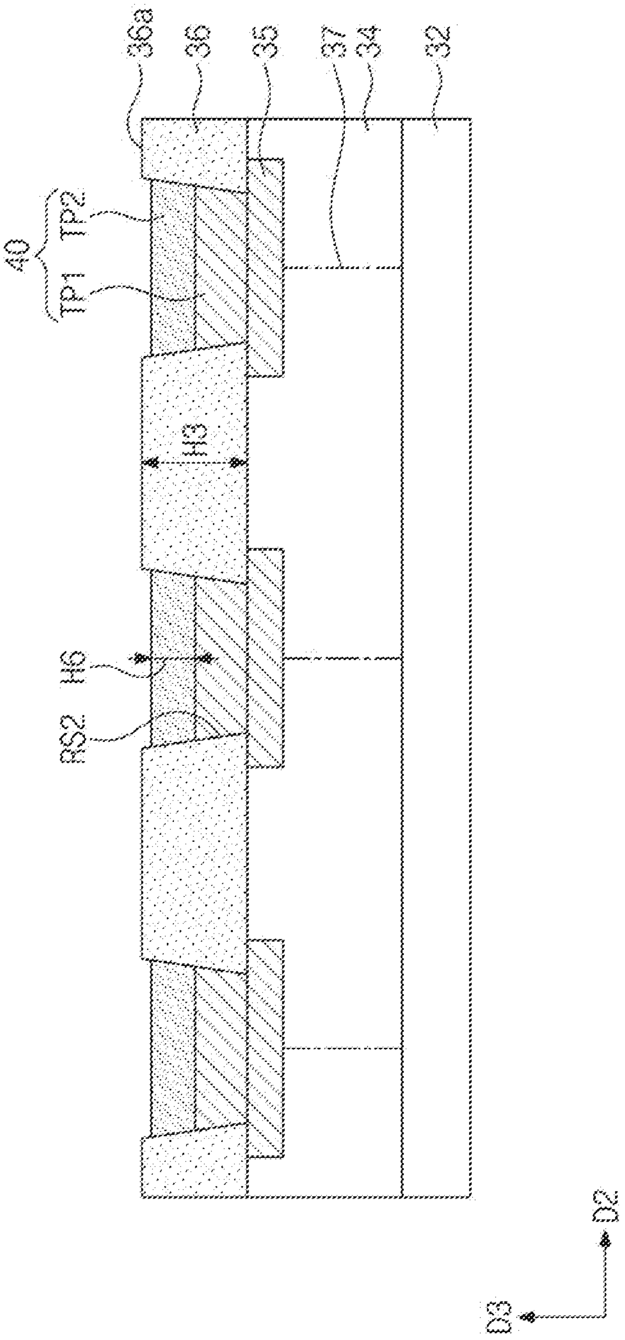

Referring to FIG. 14D, the second substrate 32 may be provided. The second circuit layer 34 may be formed on the second substrate 32. A second insulating layer 36 may be formed on the second circuit layer 34. Second recess portions RS2 may be formed by patterning the second insulating layer 36. A second conductive layer may be formed in the second recess portions RS2 and on a top surface 36*a* of the second insulating layer 36.

Thereafter, a second planarization process may be performed to form first portions TP1 of the second pads 40. The first portions TP1 of the second pads 40 may be formed by substantially the same method as that for the first portions BP1 of the first pads 20 described with reference to FIG. 14B.

After the formation of the first portions TP1 of the second pads 40, second portions TP2 of the second pads 40 may be formed. The second portions TP2 of the second pads 40 may be formed by substantially the same method as that for the second portions BP2 of the first pads 20 described with reference to FIG. 14C. The second portion TP2 of the second pads 40 may have a sixth height H6 in the third direction D3. Due to a thermal expansion of the second pad 40 in a subsequent thermal treatment process, the sixth height H6 may be smaller than the fourth height H4 of FIG. 4.

Figure 14E:
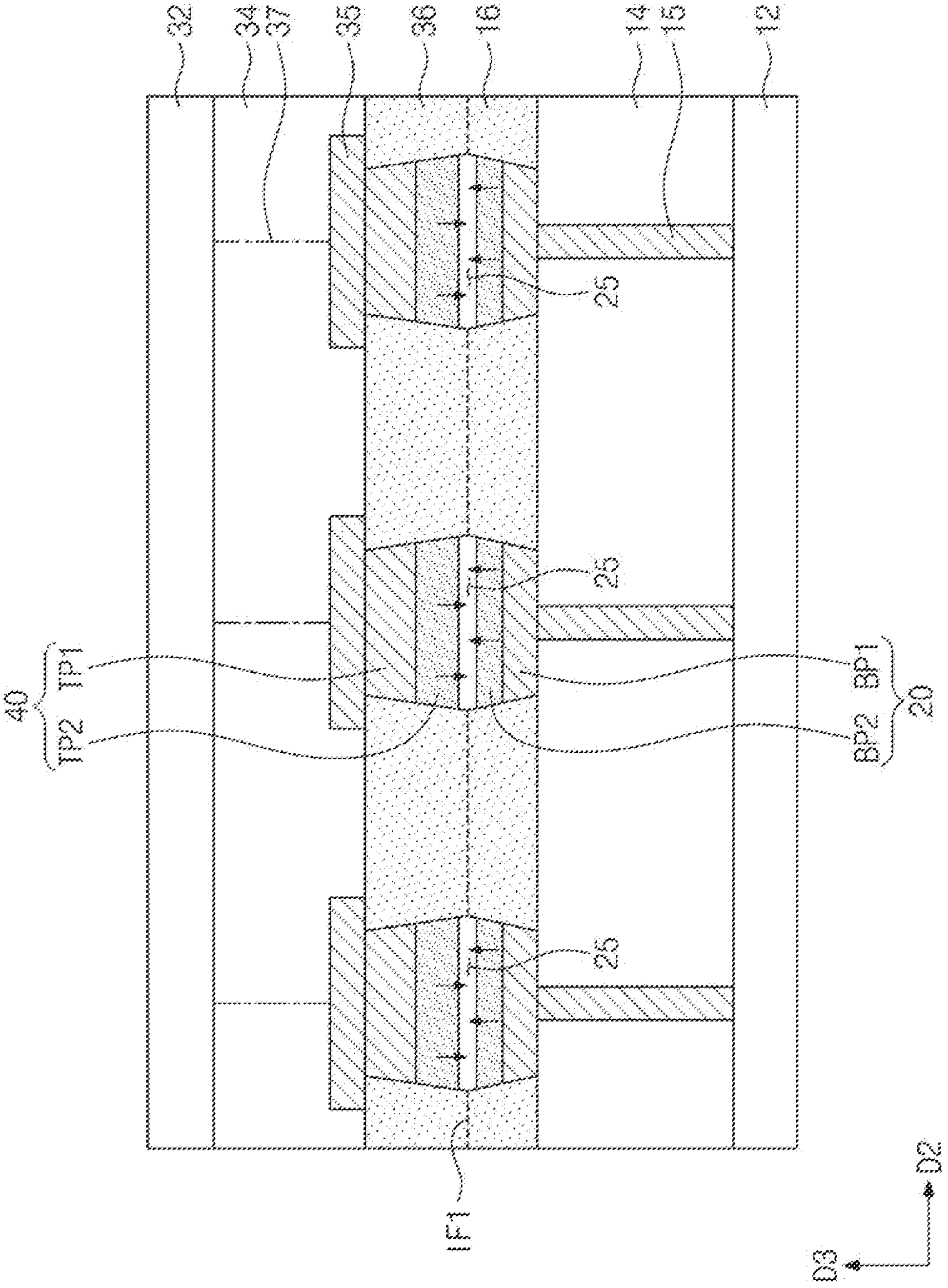

Referring to FIG. 14E, the upper structure 30 may be provided on the lower structure 10. In embodiments, the upper structure 30 may be rotated such that the first pads 20 face the second pads 40. For example, the upper structure 30 may be placed on the lower structure 10 such that the first pads 20 are vertically aligned to the second pads 40. Thereafter, the upper structure 30 may be moved to be in contact with the lower structure 10. A top surface of the first insulating layer 16 may be in contact with a top surface of the second insulating layer 36. Internal spaces 25 may be formed between the first pads 20 and the second pads 40. For example, at least a portion of a top surface of the second portion BP2 of the first pad 20 may not be in contact with a top surface of the second portion TP2 of the second pad 40.

A thermal treatment process may be performed on the lower and upper structures 10 and 30. As a result of the thermal treatment process, the second portions BP2 and TP2 of the first and second pads 20 and 40, respectively, may be thermally expanded toward the internal spaces 25. The first and second insulating layers 16 and 36 may be bonded to each other by the thermal treatment process. For example, the first and second insulating layers 16 and 36 may be formed of the same material, and in this case, there may be no interface between the first and second insulating layers 16 and 36. For example, a first interface IF1 between the first and second insulating layers 16 and 36 may not be visible, and the first and second insulating layers 16 and 36 may be used as a single layer. For example, the first and second insulating layers 16 and 36 may be bonded to each other to form a single object.

Figure 14F:
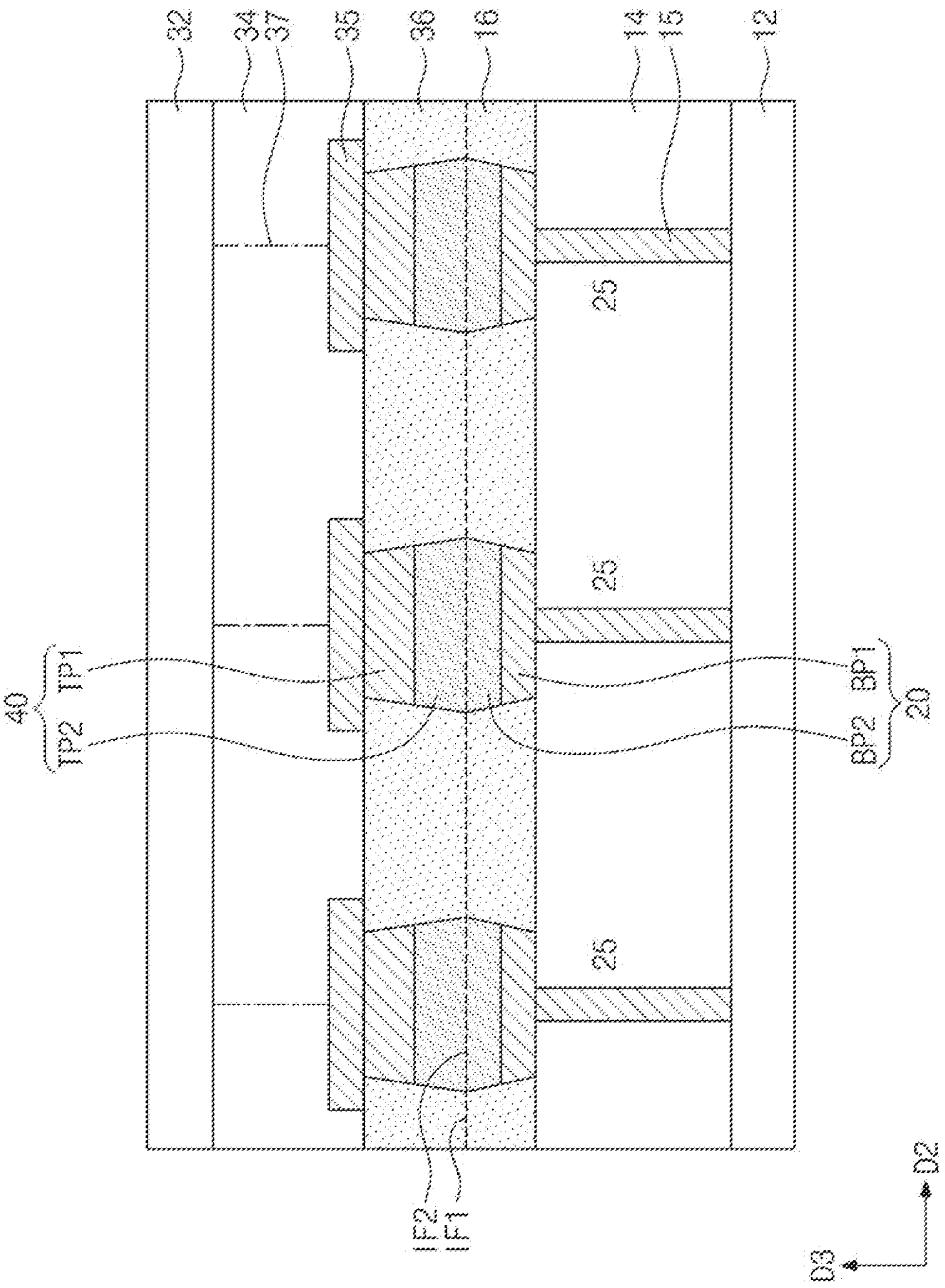

Referring to FIG. 14F, if the thermal treatment process is continued, the internal spaces 25 may be removed by the thermally-expanded second portions BP2 and TP2 of the first and second pads 20 and 40, respectively. As a result of the removal of the internal spaces 25, the first pads 20 may be bonded to the second pads 40. For example, a top surface of the second portion BP2 of the first pad 20 may be substantially the same shape as a top surface of the second portion TP2 of the second pad 40.

For example, the second portion BP2 of the first pad 20 and the second portion TP2 of the second pad 40 may be bonded to each other to form a single object. The second portions BP2 and TP2 of the first and second pads 20 and 40 may be spontaneously bonded to each other. In detail, the second portion BP2 of the first pad 20 and the second portion TP2 of the second pad 40 may be formed of the same material (e.g., copper (Cu)). The second portions BP2 and TP2 of the first and second pads 20 and 40 may be bonded to each other by an intermetal hybrid bonding process using surface activation between the second portion BP2 of the first pad 20 and the second portion TP2 of the second pad 40, which are in contact with each other. In this case, a second interface IF2 between the second portions BP2 and TP2 of the first and second pads 20 and 40 may not be visible.

A semiconductor device according to an embodiment of the inventive concept may include a pad, which includes a first portion formed by a planarization process and a second portion formed on the first portion by a selective deposition process. Since the first portion has good process reproducibility and the second portion formed by the deposition process can be finely controlled, a void may be prevented from being formed in the pad or an insulating layer. Thus, it may be possible to realize a semiconductor device with improved electrical characteristics and improved driving stability.

In a method of fabricating a semiconductor device according to an embodiment of the inventive concept, a planarization process may be performed on a conductive layer in an over-etch manner, and in this case, it may be possible to form a first portion, which is used as a part of a pad, with high reproducibility and uniformity. Thereafter, a selective deposition process may be performed to form a second portion, and this may make it possible to finely control a height of the pad. Accordingly, it may be possible to prevent a void from being formed in the pad or an insulating layer and thereby to realize a semiconductor device with improved electrical characteristics and improved driving stability.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:

a lower structure including a first substrate, a first pad on the first substrate, and a first insulating layer enclosing the first pad; and an upper structure including a second substrate, a second pad on the second substrate, and a second insulating layer enclosing the second pad, wherein each of the first and second pads comprises a first portion and a second portion on the first portion, wherein an area of a surface of the second portion that faces the first portion is the same as an area of a surface of the first portion that faces the second portion, wherein, in each of the first and second pads, a grain size of the first portion is larger than a grain size of the second portion, wherein the second portion comprises the same metallic material as the first portion, wherein the second portion of the first pad is in contact with the second portion of the second pad, and wherein the first insulating layer is in contact with the second insulating layer.

2. The semiconductor device of claim 1, wherein the second portion of the first pad and the second portion of the second pad are bonded to each other to form a single object.

3. The semiconductor device of claim 1, wherein the first insulating layer and the second insulating layer are bonded to each other to form a single object.

4. The semiconductor device of claim 1, wherein the second portion of each of the first and second pads comprises a material having a [111] direction.

5. The semiconductor device of claim 1, wherein the first pad and the second pad are at least partially overlapped with each other, when viewed in a plan view.

6. The semiconductor device of claim 1, further comprising a protection layer between the first insulating layer and the second insulating layer.

7. The semiconductor device of claim 1, wherein the metallic material comprises copper, and wherein the first and second insulating layers comprise at least one of oxide, nitride, or oxynitride materials, which include an element contained in the first and second substrates.

8. The semiconductor device of claim 1, wherein a difference between a height of the first insulating layer and a height of the first portion of the first pad is about 10 Å to about 300 Å, and wherein a difference between a height of the second insulating layer and a height of the first portion of the second pad is about 10 Å to about 300 Å.

9. A semiconductor device, comprising:

a lower structure comprising a first circuit pattern provided on a first substrate, a first insulating layer provided on the first substrate to cover the first circuit pattern, and a first pad disposed in the first insulating layer and connected to the first circuit pattern; and an upper structure vertically connected to the lower structure, the upper structure comprising a second circuit pattern provided on a second substrate, a second insulating layer provided on the second substrate to cover the second circuit pattern, and a second pad disposed in the second insulating layer and connected to the second circuit pattern, wherein the first insulating layer is in direct contact with the second insulating layer, wherein each of the first and second pads comprises a first portion and a second portion, which is provided on the first portion and includes the same metallic material as the first portion, wherein an area of a surface of the second portion that faces the first portion is the same as an area of a surface of the first portion that faces the second portion, wherein, in each of the first and second pads, a grain size of the first portion is larger than a grain size of the second portion, and wherein the second portion of the first pad and the second portion of the second pad are bonded to each other to form a single object.

10. The semiconductor device of claim 9, wherein the second portion of each of the first and second pads comprises a material having a [111] direction.

11. The semiconductor device of claim 9, further comprising a protection layer between the first and second insulating layers.

12. A method of fabricating a semiconductor device, comprising:

forming a first insulating layer on a first substrate;

patterning the first insulating layer to form a first recess portion;

forming a first conductive layer on the first insulating layer to fill the first recess portion;

performing a first planarization process on the first conductive layer to expose a top surface of the first insulating layer and to form a first portion of a first pad, a top surface of the first portion being located at a level lower than the top surface of the first insulating layer;

performing a selective deposition process to form a second portion on the first portion of the first pad, the second portion comprising the same metallic material as the first portion;

forming a second insulating layer on a second substrate;

patterning the second insulating layer to form a second recess portion;

forming a second conductive layer on the second insulating layer to fill the second recess portion;

performing a second planarization process on the second conductive layer to expose a top surface of the second insulating layer and to form a second pad; and performing a thermal treatment process to bond the first pad to the second pad, wherein an area of a surface of the second portion that faces the first portion is the same as an area of a surface of the first portion that faces the second portion, wherein a grain size of the first portion is larger than a grain size of the second portion.

13. The method of claim 12, wherein the performing of the thermal treatment process comprises:

bonding the first and second insulating layers to each other to form a single object;

thermally expanding the second portion of the first pad to be in contact with the second pad; and bonding the first and second pads to each other to form a single object.

14. The method of claim 12, wherein the forming of the first portion of the first pad comprises performing the first planarization process on the first conductive layer in an over-etch manner.

15. The method of claim 12, wherein the forming of the second pad comprises:

performing the second planarization process to form a first portion of the second pad at a level that is lower than the top surface of the second insulating layer; and performing a selective deposition process to form a second portion on the first portion of the second pad, wherein the second portion of the second pad comprises the same metallic material as the first portion of the second pad.

16. The method of claim 12, wherein the selective deposition process comprises one of a chemical vapor deposition process, a metal organic chemical vapor deposition process, an electroless deposition process, and an atomic layer deposition process.

17. The method of claim 12, further comprising forming a protection layer on the first insulating layer, before the forming of the first recess portion.

18. The method of claim 12, wherein the performing of the selective deposition process to form the second portion comprises forming a material of the second portion in a [111] direction.

* * * * *